US007885417B2

(12) United States Patent
Christoph

(10) Patent No.: US 7,885,417 B2
(45) Date of Patent: Feb. 8, 2011

(54) ACTIVE NOISE TUNING SYSTEM

(75) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1550 days.

(21) Appl. No.: 11/083,364

(22) Filed: Mar. 17, 2005

(65) Prior Publication Data

US 2005/0207585 A1 Sep. 22, 2005

(30) Foreign Application Priority Data

Mar. 17, 2004 (EP) ................................. 04006433

(51) Int. Cl.
*H03B 29/00* (2006.01)
*H04R 29/00* (2006.01)
*H04B 15/00* (2006.01)

(52) U.S. Cl. .................. 381/71.11; 381/71.1; 381/71.4; 381/71.2; 381/71.12; 381/56; 381/94.1

(58) Field of Classification Search ..... 381/71.1–71.14, 381/94.1–94.7, 56–59
See application file for complete search history.

(56) References Cited

U.S. PATENT DOCUMENTS 4,677,676 A 6/1987 Eriksson ...................... 381/47
4,878,188 A * 10/1989 Ziegler, Jr. .................. 708/300
5,170,433 A 12/1992 Elliott et al. ................ 381/517
5,410,606 A * 4/1995 Imai et al. ................ 381/71.14

FOREIGN PATENT DOCUMENTS

DE 19632230 2/1998

OTHER PUBLICATIONS

S.M. Kuo et al.: "Frequency-Domain Periodic Active Noise Control and Equalization", IEEE Transactions on Speech and Audio Processing, vol. 5, No. 4, Jul. 1997, pp. 348-358.

S.M. Kuo et al.: "Broadband Adaptive Noise Equalizer", IEEE Signal Processing Letter, vol. 3, No. 8, Aug. 1996, pp. 234-235.

S.M. Kuo et al.: "A Secondary Path Modeling Technique for Active Noise Control Systems", IEEE Transactions on Speech and Audio Processing, vol. 5, No. 4, Jul. 1997, pp. 374-377.

S.M. Kuo et al.: "Principle and Application of Adaptive Noise Equalizer", IEEE Transactions on Circuits and Systems II: Analog and Digital Signal Processing, vol. 41, No. 7, Jul. 1994, pp. 471-474.

(Continued)

*Primary Examiner*—Devona E Faulk
(74) *Attorney, Agent, or Firm*—O'Shea Getz P.C.

(57) ABSTRACT

Active noise control system and method for controlling an acoustic noise generated by a noise source at a listening location, in which system and method sound is picked up in the surroundings of the listening location by a sound sensor; an electrical noise signal which corresponds to the acoustic noise of the noise source is generated and filtered adaptively in accordance with control signals. The adaptively filtered noise signal is irradiated into the surroundings of the listening location by a sound reproduction device, where a secondary path transfer function extends between the sound reproduction device and sound sensor. The noise signal is filtered with a transfer function that models the secondary path transfer function. The signals which are provided by the sound sensor after first filtering serve as control signals for the adaptive filtering.

13 Claims, 22 Drawing Sheets

OTHER PUBLICATIONS

W. Peng et al.: "Multiband Warped Filter Equalizer Design for Loudspeaker Systems", IEEE International Conference on Acoustics, Speech, and Signal Processing, vol. 2, Jun. 2000, pp. 913-916.

S.J. Elliott et al.: "Multiple-Point Equalization in a Room Using Adaptive Digital filters", Journal of the Audio Engineering Society, vol. 37, No. 11, Nov. 1989, pp. 899-907.

M. de Diego et al.: "Some Practical Insights in Multichannel Active Noise Control Equalization", IEEE International Conference on Acoustics, Speech, and Signal Processing, vol. 2, Jun. 2000, pp. 837-840.

F. Ogden: "Goertzel Alternative to the Fourier Transform", Electronics World and Wireless World, vol. 99, No. 1687, pp. 485-487.

S.M. Kuo et al. "Active Noise Control Systems-Algorithms and DPS Implementations," 1996, pp. 141-145.

B. Widrow et al. "Adaptive Signal Processing," 1985, pp. 116-327.

* cited by examiner

ACTIVE NOISE TUNING SYSTEM

CLAIM OF PRIORITY

This patent application claims priority to European Patent Application serial number 04 006 433.9 filed on Mar. 17, 2004.

FIELD OF THE INVENTION

This invention relates to the field of signal processing, and in particular to an active noise tuning system.

RELATED ART

Systems for actively compensating noise (Active Noise Control Systems), in particular cabin noise in vehicles are known. There are known methods that compensate periodic signals (e.g., engine harmonics) and methods that are intended to reduce the level of broadband noise. While systems are known for compensating periodic noise signals that are related to the rotational speed there are already applicable implementations available, while broadband systems are not suitable for general applications owing to the very high computing capacity required.

Active noise control systems attenuate undesired noise. Noise tuning systems, on the other hand, are intended to equalize specific interferences, that is to say to change the interference spectrum with reference to any desired specification. With noise tuning systems, individual noise, what is referred to as narrowband noise or discrete noise and parts of the noise spectrum may be eliminated, left or even amplified. As active noise control systems, active noise tuning systems also have two fundamental structures, what is referred to as feedback structure and feedforward structure. These structures may be used together.

The feedback structure shown in FIG. 1 includes a loudspeaker 2 in the vicinity of a noise source 1. Active noise control unit 3 evaluates signals which are picked up by a microphone 4 (error microphone) which is further away from the noise source 1 than the loudspeaker 2 and provides a drive-signal to the cancelling loudspeaker. In most cases, stability problems occur with the feedback structure, in particular with a pure feedback structure, as it is very difficult to avoid unwanted direct feedback.

Due to the feedback problem, active noise control systems that employ a feedforward structure as shown in FIG. 2, are more favourable. In contrast to the feedback system illustrated in FIG. 1, the system of FIG. 2 includes an additional microphone 5 (i.e., reference microphone) located between the noise source 1 and the loudspeaker 2. Signals from the microphone 5 may be processed by the active noise control unit 3 along with the signal from the error microphone 4 in order to generate the drive signal to the loudspeaker 2.

It is difficult in active noise control systems to find a suitable location for the reference microphone 5 and obtain a suitable reference signal. Another problem arises from the modelling of the branch that extends between the loudspeaker 2 and the reference microphone 5, and is referred to as the acoustic feedforward branch. There are some approaches with which this acoustic feedforward branch can be modelled, but these require considerable implementation expenditure. Widely used algorithms are for example the filtered U-recursive least mean square (FURLMS) algorithm or the hybrid filtered-X least mean square (HFXLMS) algorithm.

The feedforward structure is significantly less costly and more reliable if the reference signal is present in a pure form. In the case of machines and engines that predominantly produce periodic signals, a reference signal without interference can be generated using a non-acoustic sensor (e.g., a rotational speed signal generator with downstream synthesizer) on which the acoustic feedforward branch does not have any influence. Further, such systems are relatively inexpensive.

Such a system is known for example from S. M. Kuo, Y. Young, "*Broadband Adaptive Noise Equalizer*", IEEE Signal Processing Letters, Vol. 3, No. 8, August 1996, pages 234 and 235 as well as S. M. Kuo, D. K. Morgan, "*Active Noise Control Systems—Algorithms and DSP Implementations*" New York, John Wiley & Sons, 1996, pages 141 to 145. In both cases, a sinusoidal signal generator dependent on the rotational speed is used to generate the (narrowband) reference signal. An arrangement for broadband signals using a non-acoustic sensor is known, for example, from S. M. Kuo, M. Tahernezhadi, M. J. Ji, "*Frequency-Domain Periodic Active Noise Control and Equalization*", IEEE Transactions On Speech And Audio Processing, Vol. 5, No. 4, July 1997, pages 348 to 358.

FIG. 3 illustrates in a simplified form an arrangement in which a reference signal 6 is generated by a signal generator 7 that is controlled by the noise source 1 (e.g., a non-acoustic sensor). The reference signal 6 is input to the active noise control unit 3.

An example of the design of an active noise control unit such as the active noise control unit 3 in FIGS. 1 to 3 is illustrated, for example, in S. M. Kuo, M. J. Ji, "*Principle and Application of Adaptive Noise Equalizer*" IEEE Transactions On Circuits and Systems II: Analogue And Digital Signal Processing, Vol. 41, No. 7, July 1994, pages 471 to 474, focussing on modelling of the primary path. Alternative refinements of an active noise control unit for modelling the primary path are also known, for example, from B. Widrow, S. D. Steams, "*Adaptive Signal Processing*," Prentice-Hall 1985, pages 116 to 327. In both cases, adaptive filters are used to model the primary path extending between the noise source and the error microphone.

For this adaptive filter to converge satisfactorily, it is necessary to compensate the transfer function of the secondary path from the secondary acoustic signal source (i.e., loudspeaker 2) to the error signal pickup (i.e., microphone 4). Despite modelling of the secondary path, primary acoustic signals may also occur in the secondary path, which adversely affect the convergence of the adaptive filter. Moreover, the secondary path may be time-dependent, which has a negative effect on the convergence. In S. M. Kuo, D. Vijayan, "*A Secondary Path Modelling Technique for Active Noise Control Systems*", IEEE Transactions On Speech And Audio Processing, Vol. 5, No. 4, July 1997, pages 374 to 377, an arrangement for modelling the secondary path is described; using an error predictor filter.

There is a need for active noise tuning systems with improved noise suppression.

SUMMARY

An active noise tuning system for tuning an acoustic noise generated by a noise source at a listening location comprises a sound sensor (e.g., microphone) that is arranged in the surroundings of the listening location and a noise signal source for generating an electrical signal that corresponds to the acoustic noise of the noise source. An adaptive filter that is controlled by control signals is connected downstream of the noise signal source. A sound reproduction device (e.g., loudspeaker) is connected to the adaptive filter in order to irradiate the noise signal filtered by the adaptive filter arranged in the surroundings of the listening location, a secondary path transfer function occurring between the sound reproduction device and sound sensor. A first filter having a transfer function that models the secondary path transfer function is connected to the noise signal source. The first filter and the sound sensor provide the control signals for the adaptive filter and are connected to the adaptive filter.

An active noise tuning method for tuning an acoustic noise which is generated at a listening location by a noise source comprises that sound is picked up in the surroundings of the listening location by a sound sensor (e.g., microphone). An electrical noise signal which corresponds to the acoustic noise of the noise source is generated and the noise signal is filtered adaptively in accordance with control signals. The adaptively filtered noise signal is irradiated into the surroundings of the listening location by a sound reproduction device (e.g., loudspeaker), whereby a secondary path extending between the sound reproduction device and sound sensor has a secondary path transfer function. A first filtering operation of the noise signal is carried out with a transfer function which models the secondary path transfer function and the signals which are made available by the sound sensor after first filtering being provided as control signals for the adaptive filtering.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
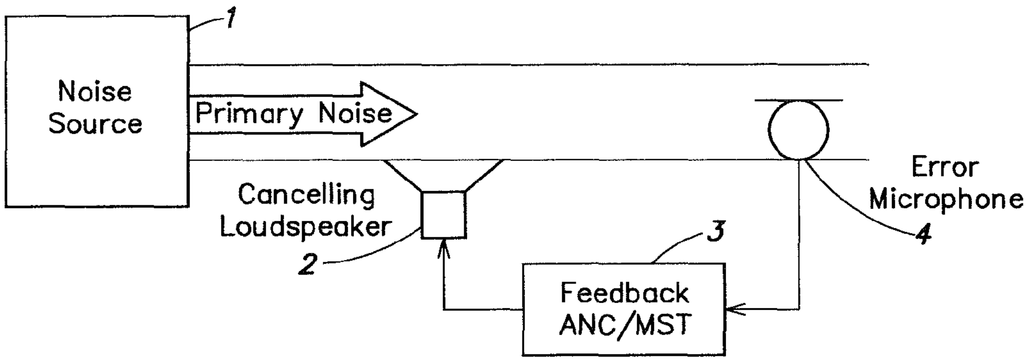
FIG. 1 (Prior Art)
FIG. 1 is a block diagram illustrating an active noise control system with a feedback path.
Figure 2:
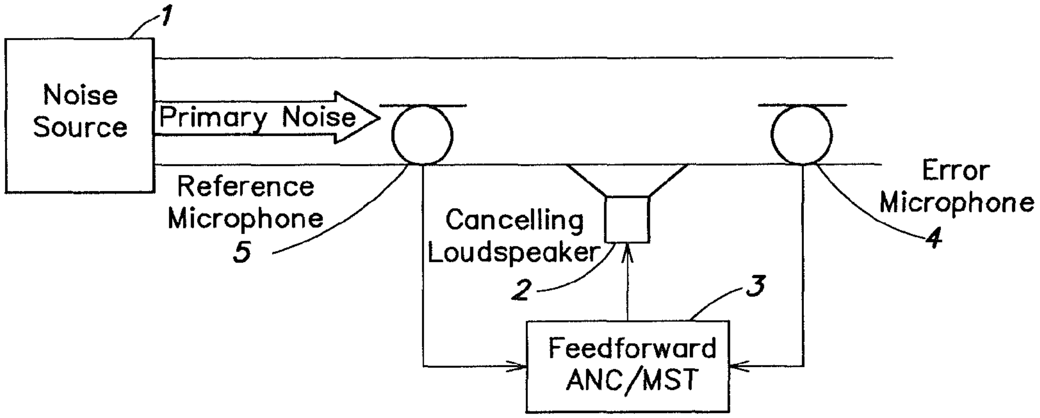
FIG. 2 (Prior Art)
FIG. 2 is a block diagram illustration of an active noise control system with a feedforward path.
Figure 3:
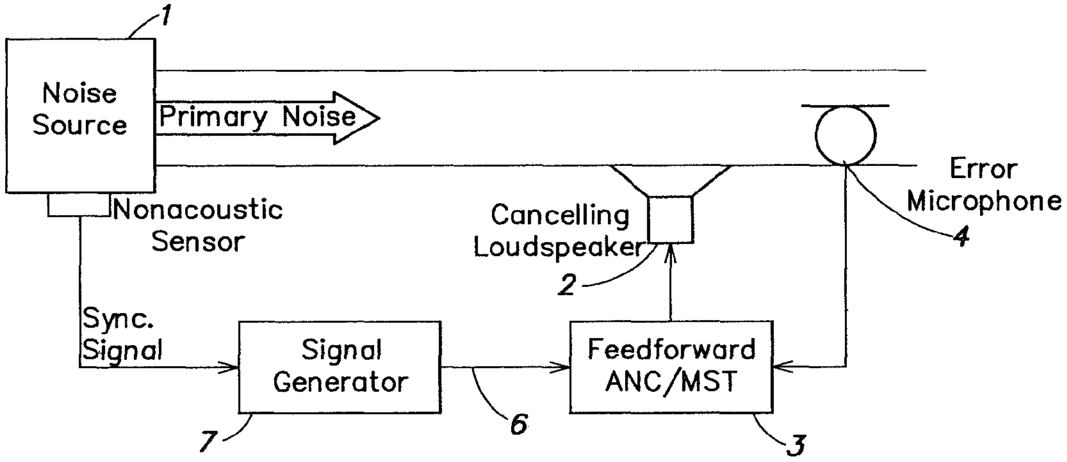
FIG. 3 (Prior Art)
FIG. 3 is a block diagram illustration of an alternative embodiment of the active noise control system of FIG. 2 with synthetic generation of the reference signal.
Figure 4:
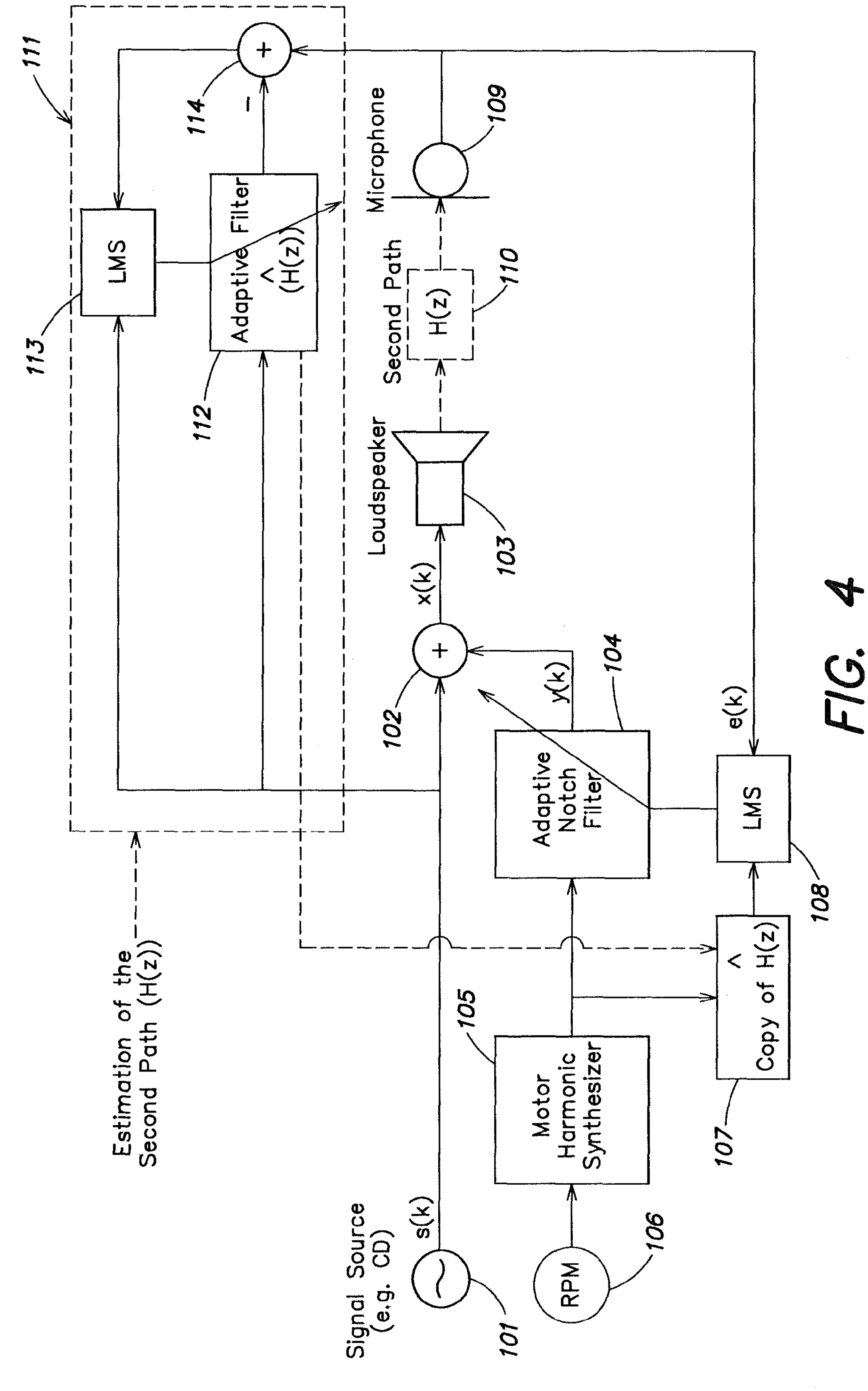
FIG. 4 is a block diagram illustration of a narrowband feed forward active noise control system with online secondary path estimation utilizing source signal and synthetic reference signal generation.

In FIG. 4, a signal s[k] from a signal source 101 is input to an adder 102. The adder 102 sums the signal s[k] and a signal y[k] that is generated by an adaptive notch filter 104. The resultant sum is output to a loudspeaker 103. The adaptive notch filter 104 receives its input signal from an engine harmonic synthesizer 105, which is controlled by a rotational speed sensor 106.

The engine harmonic synthesizer 105 generates a noise signal as a function of the rotational speed of the engine. This noise signal is input to a filter 107 having a dynamically adjustable transfer function H[z]. The output of the filter 107 is supplied to a control unit 108 which also receives a signal e[k] from a microphone 109.

The control unit 108 employs a least mean square (LMS) algorithm and controls the adaptive notch filter 104 so the output of the filter 107 is equal to the signal e[k]. The acoustic path between the loudspeaker 103 and the microphone 109, referred to as the secondary path 110, has a specific transfer function H[z].

The transfer function H[z] of the filter 107 is intended to model the transfer function H(z) of the secondary path 110. In order to determine the transfer function H(z), an estimator unit 111 is connected between the signal source 101 and the output of the microphone 109. The estimator unit 111 comprises an adaptive filter 112 and a controller 113 for adjusting the tap weights of the adaptive filter 112. The controller 113 employs for example the least mean square (LMS) algorithm.

The control device 113 and the adaptive filter 112 receive the signal s[k] from the signal source 101. The adaptive filter 112 provides an output signal that is an estimate of the signal received by the microphone 109. The estimate signal and the actual microphone output signal are input to a summer that provides a difference representative of the difference between the estimated and actual microphone output. The control device 113 also receives the difference signal in order to adjust the tap weights of the adaptive filter.

The transfer function H[z] of the adaptive filter 112 is copied into the filter 107, either on a regular basis or after each change. The filter 107 may, for example, have essentially the same structure as the filter 112, the filter 107 receiving the filter coefficients or filter parameters from the adaptive filter 112.

The active noise control/tuning system of FIG. 4 suppresses harmonic signals that are provided by the engine harmonic synthesizer and that represent the reference signal. The reference signal models the actual acoustic signal of the engine electrically, and thus makes it possible to suppress the actual (acoustic) engine noise. In motor vehicles, damping of up to 20 dB is achieved, the quality depending predominantly on the quality of the estimation of the secondary path.

An active noise control/tuning system according to FIG. 4 may be used, for example, within a hands-free device for motor vehicles and can ensure that the person making a call is not disturbed by the engine noises when making the call. Therefore, the engine noise (harmonics) which is picked up by the hands-free microphone is to the greatest possible extent suppressed before the actual hands-free device processes the signals supplied to it. The hands-free device typically includes an echo canceller and a noise reduction unit.

Preprocessing is necessary especially because the known noise reduction algorithms are normally based on a spectral subtraction. Although these known algorithms are suitable for removing broadband noise (e.g., white noise), they are often unsuitable in case of energy-rich narrowband noise such as is generated, for example, by an internal combustion engine.

Figure 5:
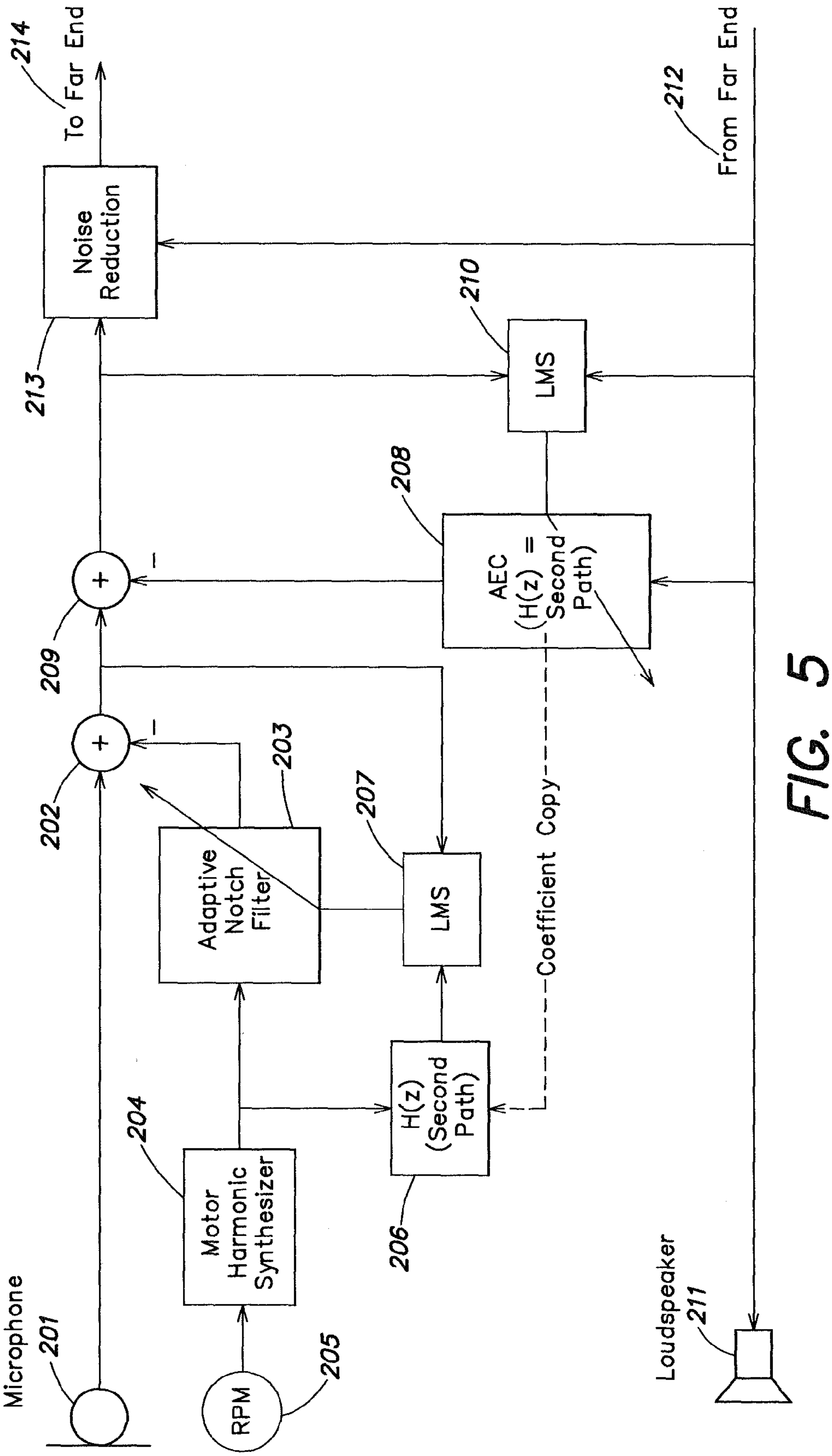
FIG. 5 is a block diagram illustration of a system combining an active noise control system with a hands free system.

The active noise tuning system as shown in FIG. 4 can be integrated into a hands-free system since the estimation of the unknown transfer function is already performed by the echo cancelling algorithm in the time domain, and thus does not need to be carried out anymore. Such a hands-free device is shown in FIG. 5. The output signal from a hands-free microphone 201 is supplied to a subtractor 202, which subtracts the output signal of an adaptive notch filter 203 from the output signal of the microphone 201. The adaptive notch filter 203 is connected downstream of an engine harmonic synthesizer 204 from which it receives reference signals corresponding to the engine noise. The engine harmonic synthesizer 204 is controlled as a function of the rotational speed of the engine by a rotational speed signal generator 205. The output signal of the engine harmonic synthesizer 204 is supplied to a filter 206 having adjustable filter coefficients. A control device 207 for the adaptive notch filter 203 is connected downstream of the filter 206, and the control device 207 employs the least mean square (LMS) algorithm. The control device 207 also receives the output signal of the subtractor 202.

A subtractor 209 subtracts the output signal of the adaptive echo canceller filter 208 from the output signal of the subtractor 202. The resultant output of the subtractor 209 is supplied to a control device 210 for controlling the adaptive echo canceller filter 208. The control device 210 receives a transmit signal 212, which is output via a loudspeaker 211. The signal 212 originates from a remote subscriber unit (not illustrated in detail in the drawings).

The output signal of the subtractor 209 is also supplied to a noise reduction device 213, which also receives the signal 212. The noise reduction device 213 outputs a transmit signal 214 that is provided to a remote subscriber unit (not illustrated).

The transfer function H[z] of the adaptive echo canceller filter 208 is copied into the filter 206, either at regular intervals or after each change. The filter 206 may, for example, have essentially the same structure as the adaptive echo canceller filter 208, and the filter 206 receives the filter coefficients or filter parameters from the echo canceller filter 208.

Figure 6:
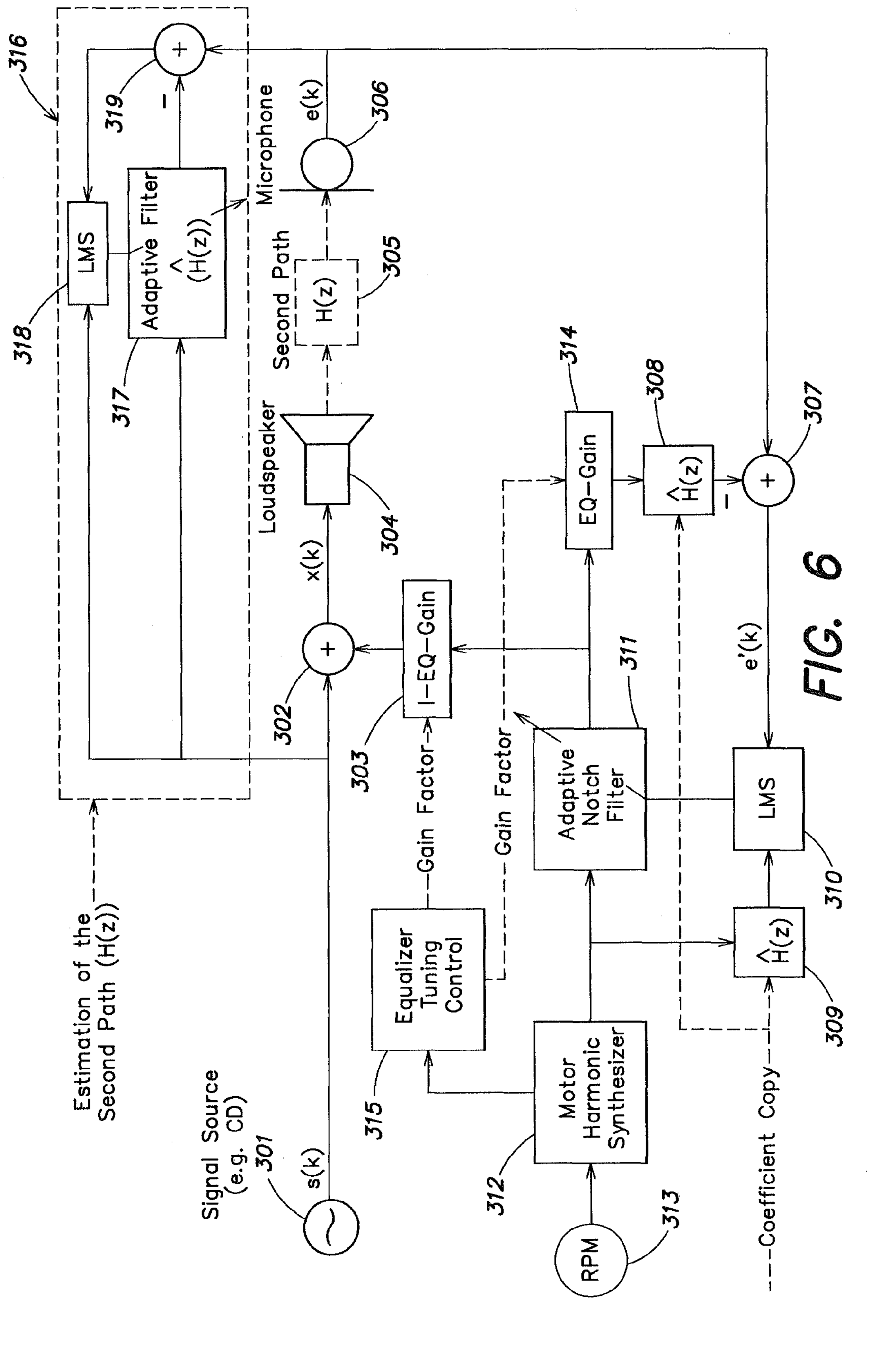
FIG. 6 is a block diagram illustration of a noise tuning system according to an aspect of the invention.

While the emphasis is on noise suppression in the embodiments illustrated in FIGS. 4 and 5, the purpose in the system shown in FIG. 6 is to set a specific engine sound characteristic based upon the preferences of a listener. In the system of FIG. 6, a signal s[k] of a signal source 301 (e.g., a compact disc player) is fed to an adder 302 which adds the signal s[k] to the output signal of an amplifier unit 303, and generates a signal x[k] that is output to a loudspeaker 304.

The loudspeaker 304 outputs this signal and transmits it to a microphone 306 via a secondary path 305 having a transfer function H(z). The microphone 306 converts the acoustic signals received via the secondary path 305 into an electrical signal e[k], which is supplied to a subtractor 307. The subtractor 307 subtracts from the signal e[k] the output signal of a filter 308 whose filter coefficients are controllable. The subtractor 307 generates a signal e'(k) which, like the output signal of a filter 309, is fed with an adjustable coefficient to a control unit 310 for controlling an adaptive notch filter 311.

The filter 309 receives, just like the adaptive notch filter 311, its input signal from an engine harmonic synthesizer 312 that is controlled by a rotational speed signal generator 313. The output signal of the adaptive notch filter 311 is supplied to the amplifier unit 303, and to a further amplifier unit 314. The gains of the two amplifier units 303 and 314 are controlled by an equalizer tuning control unit 315, which is controlled by the engine harmonic synthesizer 312.

The coefficients of the filters 308 and 309 are provided by an estimator unit 316 that is connected between the output of the signal source 301 and the output of the microphone 306. The estimator unit 316 comprises an adaptive filter 317 which, like a control device 318 for the adaptive filter 317, is actuated using the signal s[k] of the signal source 301. The control device 318, which employs a least mean square (LMS) routine, and receives a signal from a subtractor 319 representative of the difference of the output signal of the adaptive filter 317 and the output signal of the microphone 306.

The control device 318 controls the filter coefficients of the adaptive filter 317 in such way that the least mean squares are at a minimum. The filter coefficients are then copied into the filters 308 and 309 at regular time intervals or alternatively only when changes occur. The transfer function H[z] is then approximated to the transfer function H(z) of the secondary path 305.

The arrangement shown in FIG. 6 constitutes a further example of the active noise control system according to FIG. 4. Here, not only specific frequencies can be eliminated but also a specific engine sound characteristic can be generated as, in corresponding to the vehicle speed. It is desirable to make the noise of the engine more pleasant since it provides valuable audio feedback information regarding the engine.

The gains of the amplifier units 303 and 314 are selected in such a way that the amplifier unit 314 has an amplification equal to EQ (a), while the amplifier unit 303 has a gain of 1−EQ (1−a). If EQ is not equal to zero, the corresponding harmonic is influenced. It is damped at values between 0 and 1 and amplified at values greater than 1. If EQ is equal to 1, the "engine sound tuning" is deactivated and does not bring about any change at the error microphone 306.

The particular property of the system shown in FIG. 6 is that it behaves as a simple active noise control system independently of the instantaneous value of the equalizing factor EQ. More details on this are given in the articles by S. M. Kuo and M. J. Ji, "Development and Analysis of an Adaptive Noise Equalizer" and S. M. Kuo and D. K. Morgan, "Active Noise Control Systems" which are mentioned at the beginning and are included here by reference.

If it is desired to form a specific sound pattern, the desired frequency-dependent EQ profiles must be provided for each harmonic separately. The curve profiles may be provided for example by using simple polynomials. These curve profiles or polynomial coefficients are stored for each harmonic, for example as a lookup table in a memory.

In order to explain the functional principle, an active noise tuning system which is in the compensated, that is to say in the steady state, will be used as the basis for the following explanations. The intention is that narrowband noise will not be completely cancelled out but rather only damped by, for example, 6 dB. For this purpose, a value of EQ=0.5 is set. In the cancelling branch, it becomes apparent that the cancelling signal, which has been reduced by half, no longer leads to complete cancelling at the acoustic summing point, namely error microphone (microphone 306 in the system of FIG. 6), but rather only brings about a fifty percent reduction of the interference signal, that is to say damps it by the desired 6 dB.

So that this aimed-at state is retained, the LMS algorithm is modified in such a way that it no longer brings about any change as, of course, the desired state has already been reached. For this reason, the remainder, which is still absent for the sake of complete acoustic cancelling, is subtracted electrically which takes place in what is referred to as the balancing branch.

For the sake of clarification, details will be given once more on the initial situation, that is, on the active noise control system in the steady state. In this state, the cancelling signal is transmitted over the entire secondary path from the signal source 301 to the error microphone 306 via the intermediately connected components including the listening room, during which there is acoustic cancelling of the interference signal.

However, in the system of FIG. 6, only half of the cancelling signal is fed into the "real" secondary path and the remainder, the other half of the cancelling signal, which is necessary for the complete reduction of the noise (signal), is fed into the secondary path which is approximated electrically. The output signal of the adaptive filter 317 which approximates the secondary path is subtracted from the error microphone signal e[k] and thus forms the resulting error signal e'(k). The LMS algorithm of the adaptive notch filter 311 is ultimately operated using this resulting error signal e'(k). The resulting filter signal e'(k) is zero in the ideal case, that is in the case in which the approximated secondary path corresponds precisely to the actual secondary path, so that the LMS algorithm no longer continues to adapt but rather stays in a steady state.

In the case of "motor sound tuning" (as in FIG. 6), in contrast to a pure active noise control system, the output of the error signal is subtracted from the actual error microphone signal in such a way that the LMS algorithm in the control unit 310 for the adaptive filter 311 "assumes" that it has already reached its target although the actual signal from the error microphone does not have to be zero at all. In this way, the motor sound tuning system can be used to bring about any desired equalization of the noise without comprising a risk of instabilities in the adaptive filter 311 and in particular in the LMS algorithm which is provided to control it.

Figure 7:
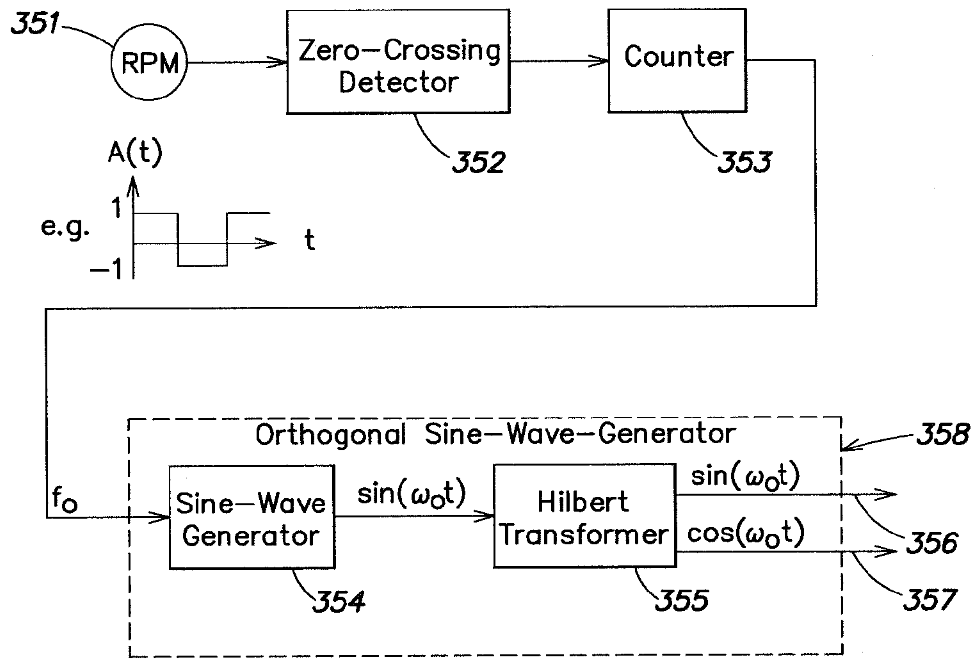
FIG. 7 is a block diagram illustration of a reference signal generator for use in the noise tuning system.

FIG. 7 shows an arrangement in which a fundamental $f_0$ is used to control a sinusoidal wave generator 354. A rotational speed signal generator 351 provides a rotational speed signal that is input to a cascaded zero crossing detector 352 and a counter 353, which provides the fundamental $f_0$.

The sinusoidal wave generator 354 generates a sinusoidal signal $\sin(\omega_0 t)$ from the signal $f_0$ which has a square wave superimposed on a triangular wave, and the sinusoidal signal $\sin(\omega_0 t)$ is input to a Hilbert transformer 355. The transformer 355 generates two orthogonal signals 356 and 357, equal to $\sin(\omega_0 t)$, $\cos(\omega_0 t)$, respectively. The sine-wave generator 354 and the Hilbert transformer 355 combine to provide an orthogonal sinusoidal wave generator 358.

The arrangement shown in FIG. 7 uses a rotational speed signal generator to generate the rotational speed signal in revolutions per minute (RPM), such as are usually already present in motor vehicles. One or more reference signals are synthesized from the rotational speed signal. In motor vehicles, Hall generators are usually used as the rotational speed sensors, and typically provide DC-free square-wave signals as output signals.

As shown in FIG. 7, the fundamental $f_0$ is determined from such a DC-free square-wave signal. The fundamental $f_0$ is determined by the counter 353 which measures the duration of a half wave in each case. Here, for example, a zero crossover point detector, such as the zero crossing detector 352 from FIG. 7 or alternatively a simple sign tester, may be used to determine whether or not the polarity has changed at a particular time. As soon as a change in polarity, such as for example a change from the positive to the negative half wave and vice versa has been detected, the counter is re-initialised.

The N desired higher harmonics ($f_1, \ldots, f_N$) are synthesized on the basis of this fundamental $f_0$. The periodic noise signal source (for example motor vehicle engine) is analyzed to determine the relationship between the fundamental $f_0$ and the higher harmonics $f_1, \ldots, f_N$. With respect to internal combustion engines, the number of cylinders of the engine to be investigated is significant. The synthesization of the higher harmonics $f_1, \ldots, f_N$ from the fundamental $f_0$ in a four-cylinder spark ignition engine is obtained from $$f_i=(i+1)f_0/2$$

where i=0, . . . , N and N~15, 16, 17. N=15 to 17 corresponds to frequencies between 400 and 500 Hz.

After the desired N harmonics are present, one or more time signals are generated that represent the synthesized reference signals. As an adaptive notch filter is provided, and the latter expects the reference signal in its orthogonal form, an orthogonal sinusoidal signal generator is required.

An alternative arrangement of an orthogonal sinusoidal signal generator is shown in FIG. 7. The sinusoidal wave generator 354 may be implemented as a limit-stable second order infinite impulse response (IIR) filter. The Hilbert transformer 355, which may be required only to operate correctly on one particular discrete frequency, specifically the fundamental $f_0$, is implemented using a single-point Hilbert transformer.

The Hilbert transformer may be configured as a first order all-pass filter whose cut-off frequency is set to the oscillator frequency of the sinusoidal wave generator. Furthermore, there exist other possible ways of implementing orthogonal sinusoidal generators. In particular, there are implementations that employ a recursive quadrature oscillator or a coupled oscillator. The coupled oscillator is somewhat more costly to implement but also more robust with respect to quantization effects.

As described above, a basic active noise control/tuning system for tuning an acoustic noise generated by a noise source at a listening location comprises a sound sensor (e.g., microphone) which is arranged in the surroundings of the listening location and a noise signal source for generating an electrical signal that corresponds to the acoustic noise of the noise source. An adaptive filter controlled by control signals is connected downstream of the noise signal source. A sound reproduction device (e.g., loudspeaker) is connected to the adaptive filter and irradiates the noise signal filtered by the adaptive filter which is arranged in the surroundings of the listening location. A secondary path transfer function is representative of the ambient environment between the sound reproduction device and sound sensor. A first filter with a transfer function that models the secondary path transfer function is connected to the noise signal source. The first filter and the sound sensor provide the control signals for the adaptive filter and are connected thereto.

A first amplifier unit with a first gain and a second amplifier unit with a second gain may be connected downstream of the adaptive filter, a second filter with a transfer function which models the secondary path transfer function being connected downstream of the second amplifier unit. The sound reproduction device is connected to the first amplifier unit in order to irradiate the noise signal which is filtered by the adaptive filter and amplified by the first amplifier unit. The first filter, the second filter and the sound sensor are also connected to the adaptive filter in order to provide the control signals.

Furthermore, a test signal source for generating a test signal may be connected to the sound reproduction device. An evaluation device which is coupled to the sound sensor may then determine the secondary path transfer function using the test signal received by the sound sensor, and may control the first and/or second filter(s). A further adaptive filter which is coupled to the test signal source and the sound sensor may, as part of an evaluation device, model the secondary path transfer function and control the first and/or second filter(s). Furthermore, a desired signal (e.g., music) may be irradiated by the sound reproduction device, whereby the desired signal also being used as a test signal.

Alternatively, a signal other than the desired signal, such as in particular a sinusoidal signal that varies in frequency, or narrowband noise which varies in frequency, or broadband noise may also be provided as the test signal. The test signal may have such a low level that it is not perceived, or is not perceived as disruptive, by the listener. However, the test signal preferably has a level that is below the audibility threshold. The first gain is preferably equal to 1−a, and the second gain equal to a, a being a coefficient and being between −1 and 1. The coefficient a may be made available by a control device. The control device may set the coefficient a as a function of the noise signal.

An adaptive notch filter may be provided as the adaptive filter. At least one of the two adaptive filters may operate using the least mean square algorithm. Further, devices may be provided which subtract from one another signals that are supplied by the second filter and the sound transducer. The synthetically generated noise signal preferably has a fundamental and at least one harmonic; in each case a separate adaptive filter, first filter, second filter, first amplifier unit and second amplifier unit being provided for each of the fundamental and harmonic/harmonics. The acoustic noise source can be an engine with a fixed or varying rotational speed. A synthesizer generating a noise signal—in so doing generating a corresponding sound profile—which is typical of the respective rotational speed of the engine may be provided as the (synthetic, electrical) noise signal source. For this purpose, the synthesizer may generate a fundamental having a frequency equal to the rotational speed of the engine, or a multiple thereof. The synthesizer may generate both the fundamental and harmonics. The synthesizer preferably provides the fundamental and/or the harmonics as orthogonal noise signals. For this purpose, the first filter is preferably of double design, one of the orthogonal noise signals being fed to one of the two first filters, and the other of the orthogonal noise signals being fed to the other first filter. A plurality of sound profiles for various engines may be stored in the synthesizer so that the driver of a vehicle can select from different car or motor sounds. Various values for the coefficients "a" for the fundamental and harmonic(s)—resulting in various target profiles—may be stored in the control device. Also, a plurality of sound reproduction devices and/or sound sensors may be provided. The sound reproduction device or devices may have at least one loudspeaker. The sound reproduction device may have, alternatively or additionally, an actuator for generating solid-borne sound. An active noise control/tuning system may be used in a motor vehicle and/or in a hands-free device of a telephone.

The above systems according to the invention may in particular be implemented into a microprocessor, a microcontroller or the like. Such system may perform an active noise control/tuning for tuning an acoustic noise that is generated at a listening location by a noise source comprises the following steps:

a) Sound is picked up in the surroundings of the listening location by a sound sensor (e.g., a microphone);
b) an electrical noise signal which corresponds to the acoustic noise of the noise source is generated;
c) the noise signal is adaptively filtered in accordance with control signals;
d) the adaptively filtered noise signal is irradiated into the surroundings of the listening location by a sound reproduction device (e.g., loudspeaker), whereby a secondary path extending between the sound reproduction device and sound sensor is characterized by a secondary path transfer function;
e) a first filtering operation of the noise signal is carried out with a transfer function that models the secondary path transfer function; and
f) the signals that are made available by the sound sensor after first filtering being provided as control signals for the adaptive filtering.

In addition, the following measures may be provided:

The adaptively filtered noise signal is amplified with a first gain, and the adaptively filtered noise signal is amplified with a second gain. The adaptively filtered noise signal that is amplified with the first gain is irradiated into the surroundings of the listening location by sound reproduction device. A first filtering operation of the noise signal is carried out with a transfer function which models the secondary path transfer function. A second filtering operation of the adaptively filtered noise signal which is amplified with the second gain is carried out with a transfer function that models the secondary path transfer function. The signals which are made available by the sound sensor after first filtering and second filtering being provided as control signals for the adaptive filtering.

A test signal may be generated and reproduced by the sound reproduction device, and the secondary path transfer function may be determined by the test signal received by the sound sensor. The first and second filtering operations may be set based upon the determined secondary path transfer function. In order to determine the secondary path transfer function, further adaptive filtering may be carried out by the test signal and a signal supplied by the sound sensor. Again, the first gain may be set to be equal to 1−a, and the second gain to be equal to a, where a is a coefficient and between −1 and 1.

As already mentioned with respect to the embodiments set forth in FIGS. 5 and 6, it is a problem of how to determine, within an Active Noise Control (ANC) or Motor Sound Tuning (MST) system, the transfer function from a "secondary loudspeaker" (secondary source). That is to say the extinction loudspeaker which generates the anti-noise to the error microphone during operation. Real-time determination of the relevant transfer function from the secondary loudspeaker to the error microphone, also referred to as the "secondary path" below, is necessary only in instances of application in which the secondary path can change continuously to a great extent. In this context, the probability of such a change occurring is greater the further away the secondary loudspeaker is located from the error microphone.

Since ANC/MST systems primarily are used in cars, it is appropriate to analyse this environment in more detail. For system reasons, the large number of interiors which appear mean that the vehicle interior permits no global noise reduction or engine sound alteration, or this can be achieved only with a great deal of complexity. ANC/MST systems for motor vehicles are therefore limited to a spatially limited zone of silence, that is an area around the error microphone in the vehicle interior in which the anti-noise is effective. In this case, the magnitude of the zone of silence that is obtained around the error microphone is frequency-dependent and decreases as the frequency increases, which effects basically an upwardly limited frequency range in ANC/MST systems. The upper cut-off frequency in this context is dependent exclusively on the minimum permissible extent of the zone of silence. As the distance between the secondary loudspeaker and the error microphone increases, an approximately spherical zone of silence forms around the error microphone whose radius has an approximate magnitude of $R_{zone\ of\ silence} \sim \lambda/10$. Taking into account the freedom of movement which a vehicle occupant has, one is normally limited to a frequency range up to approximately $f_{max} \sim 500$ Hz when a single error microphone is used.

One challenge with ANC/MST systems is to enlarge this zone of silence in order to increase the occupants' freedom of movement and/or the usable frequency range. A simple, productive, but not especially implementation-friendly way of achieving this is to use a plurality of error microphones. However the complexity increases exponentially with the number of microphones. An admittedly less productive but, to compensate, much more effective and less complex method is obtained, by way of example, through the use of directional microphones or through the use of beam formers, which merely receive signals from the direction in which the zone of silence is to be formed. In this context, although a plurality of microphones are likewise required in the case of a beam former, they deliver just a single error microphone signal which is evaluated by the ANC/MST system.

Given that no global control is possible, the position of the error microphone(s) in car applications need to be arranged as close as possible to the head of the occupant(s), in which case the headrest or the vehicle roof would be suitable as a possible location for attachment. To reduce costs and to be able to make the zone of silence as large as possible, the audio system loudspeakers which are already present in the vehicle can also be jointly used by the ANC/MST system, in which case, on account of the normally large spatial separation between the secondary loudspeaker and the error microphone, continuous determination of the secondary path ought then to be absolutely necessary. One way in which we might be able to dispense with continuous determination of the secondary path, is to use, instead of the audio system's loudspeakers which already exist in the vehicle, dedicated secondary loudspeakers which then need to be much closer to the error microphone, in which case a suitable place of attachment would be the headrest. In such a system, in which both the error microphone and the secondary loudspeakers are built into a seat, reference is made to the "silent seat".

As already mentioned, the audio loudspeakers already present may be used for an ANC/MST system and hence the costs, which are significant for car manufacturers, would be reduced if the secondary path can be determined continuously over time.

Figure 8:
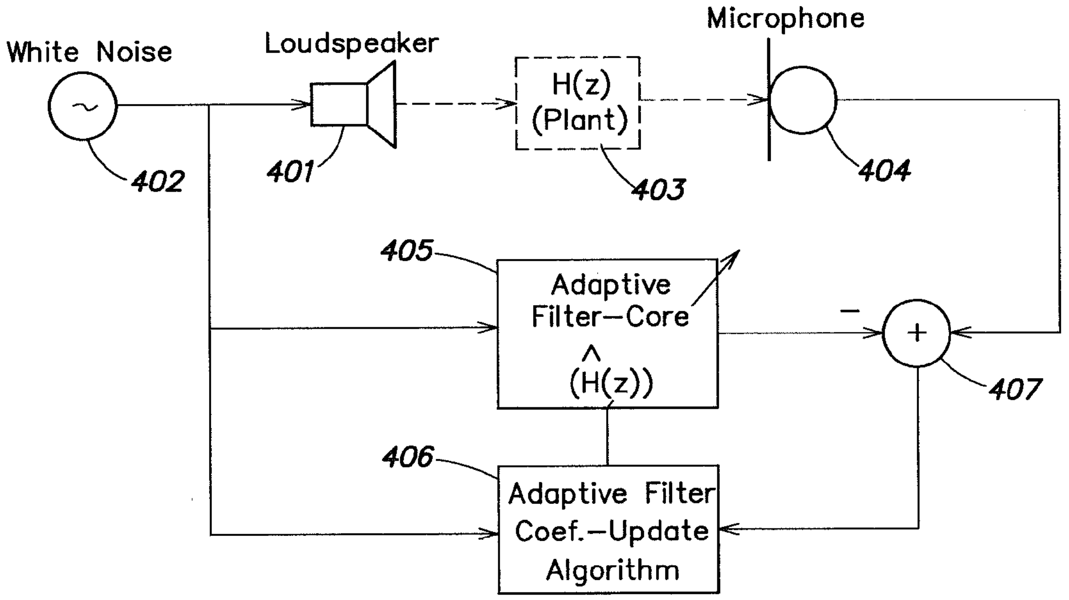
FIG. 8 is a block diagram illustration of a system for estimating an unknown system such as a secondary path using an adaptive filter.

An example of a system for estimating an unknown system (e.g., secondary path) using an adaptive filter is shown in FIG. 8. A loudspeaker 401 that generates the anti-noise is supplied with white noise from a noise source 402. The anti-noise generated by the loudspeaker 401 is transferred to a microphone 404 via a secondary path 403 having a transfer function H(z). An adaptive filter is connected to the noise source 402 and the microphone 404; the adaptive filter comprises an adaptive filter core 405 and an adaptive coefficient update unit 406, both supplied with noise from the noise source 402. The adaptive coefficient update unit 406 also receives an error signal and controls the adaptive filter core 405 such that it calculates an updated set of coefficients from the noise signal and the error signal and changes the coefficients of the adaptive filter core 405 if the updated set differs from the set present in the adaptive filter core 405. The error signal is provided by a subtractor 407 that computes the difference between the signal from the adaptive filter core 405 and the microphone 404.

The problem of determining the secondary path is initially simply in the form of estimation of an unknown system (e.g., secondary path 403) which changes continuously over time and is situated between the (secondary) loudspeaker 401 and the error microphone 404. Since the system (secondary path 403) may change over time, the estimation needs to take place continuously, which means that just one of the adaptive methods of approximating the transfer function is suitable in this case.

Although broadband determination of the secondary path is desirable, it is not absolutely necessary. Moreover, in practice it is very difficult to implement a broadband ANC/MST system in motor vehicles. The difficulty in this context is primarily in the provision of a broadband reference signal for the ANC/MST system which contains only the noise signal and no source signal. The problem is usually evaded by using a synthesized reference signal obtained from a non-acoustic signal instead of a signal from at least one reference microphone, which may not or only inadequately meet the above demand. Since the synthesized reference signal usually has a narrowband nature, the secondary path also needs to be approximated just in this narrowband frequency range. In motor vehicles primarily road noise and engine noise effect low-frequency disturbances. The RPM signal already available in most cars may be used to synthesize reference signals for extinguishing engine harmonics, which act as narrowband noise sources.

In contrast, suppressing road noise is not as simple, since non-acoustic sensors are not yet normally available. In this context, by way of example, a respective multidimensional acceleration sensor would need to be fitted for each wheel, the signals from these sensors then being able to be used to synthesize the reference signal(s).

For suppressing the engine harmonics, it is sufficient to estimate the secondary path at the frequency point at which the engine harmonic under consideration is situated. Hence, pinpoint determination of the secondary path would be satisfactory. However, since we have to deal not with one, but rather sometimes with a large number of harmonics and these normally even change on the basis of the RPM, more or less the entire secondary path is covered in terms of frequency, so that broadband approximation of the secondary path would be advantageous, despite the narrowband nature of the disturbances.

For this reason, the possibility of continuous broadband determination of the secondary path will be examined below with reference to FIG. 9. Determining a secondary path can be done only if the measurement signal has a certain minimum amplitude. In this context, the amplitude of the measurement signal is dependent on the current signal-to-noise ratio (SNR), with the following relation: the smaller the SNR (i.e., the greater the noise signal in relation to the source-signal), the larger the measurement signal needs to be. The reverse applies for the opposite case.

In addition, the amplitude of the measurement signal is closely related to the rotational speed, with the following relation: the larger the measurement signal, the faster the filter adapts. Therefore, a high level measurement signal would always be preferable for determining the secondary path. For broadband estimation of the secondary path, white noise is used which needs to have a high modulation level for exact and rapid determination. However, this means that the noise level within the actual zone of silence rises. This dilemma is the actual problem with approximating the secondary path in real time. On the one hand, a highly modulated measurement signal is needed in order to determine the secondary path with sufficient quality and speed, and on the other hand, a disturbance is generated that amplifies the noise which is to be reduced within the zone of silence.

One way in which the problem of broadband estimation of the secondary path can be alleviated is to color the measurement signal (e.g., white noise) on the basis of the spectral distribution of the currently prevailing background noise. In this case, the coefficients of the filter which colors the white noise measurement signal can be efficiently calculated recursively from the error signal, for example by using Linear Predictive Coding (LPC) analysis. In addition, the amplitude of the measurement signal may be reduced further if, instead of white noise, a "perfect" sequence were to be used for determining the secondary path. The sequence would need to be coloured in the same way as described above.

The same problems as outlined above also exist in Acoustic Echo Cancellation (AEC) systems from Double Talk Detection (DTD), namely that the unknown system (secondary path) can be estimated correctly only if the measurement signal has a larger or at least the same amplitude as the noise signal.

Another option, although one which demands a high level of implementation complexity, involves continuously determining the masking threshold of the microphone signal and modulating the white noise measurement signal using this masking threshold. The advantage of this would be that a measurement signal coloured in this manner is imperceptible to humans and is nevertheless, at least in many frequency ranges, above the background noise and would thus allow estimation of the secondary path, at least at that point. The frequency points at which the measurement signal is smaller than or equal to the noise signal cannot be estimated correctly, but the use of, by way of example, an adaptive FIR filter for broadband approximation of the secondary path results in interpolation over the frequency. This means that the incorrect points of the estimated transfer function ought not to differ too much from their true value.

Figure 9:
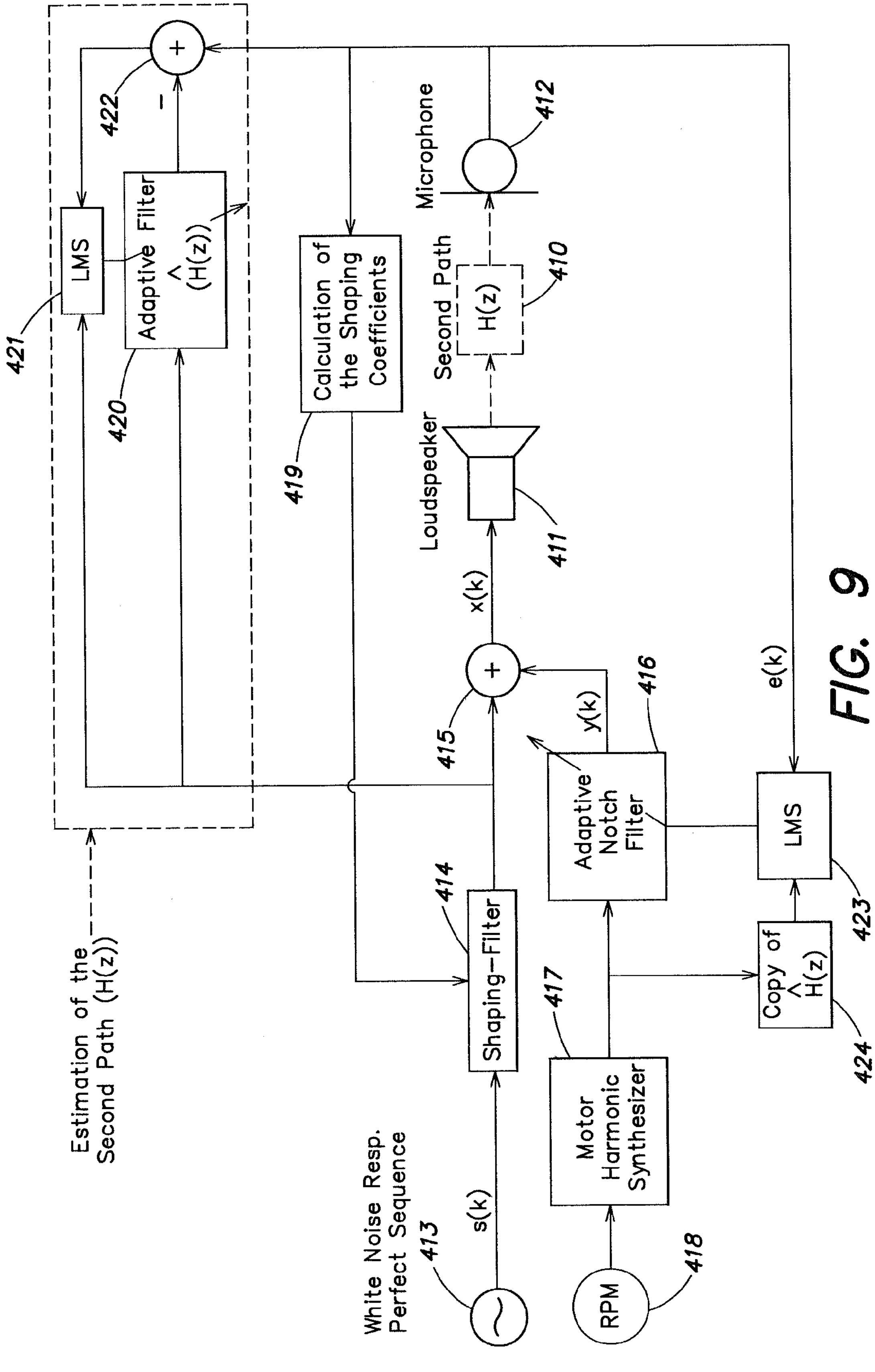
FIG. 9 is a block diagram illustration of a system comprising broadband determination of the secondary path by additional measurement signals.

FIG. 9 illustrates a system comprising broadband determination of the secondary path by additional measurement signals. In this system, a secondary path 410 is between a loudspeaker 411 and a microphone 412. The loudspeaker 411 is supplied with a noise signal s[k] from a noise source 413 via a shaping filter 414 for changing the colour of the noise signal s[k]. The noise signal s[k] is white noise or a perfect sequence. The output signal from the shaping filter 414 is input to an adder 415, along with a signal y[k] from an adaptive notch filter 416 and the resultant sum is a signal x[k] that is supplied to the loudspeaker. The adaptive notch filter 416 receives its input signal from an engine harmonic synthesizer 417 that is controlled by a rotational speed signal generator 418. The adaptive notch filter 416 is controlled by a LMS coefficient update unit 417 which receives the signal e[k] provided by the microphone 412 and the signal from the motor harmonic synthesizer 423 filtered by a filter 424.

The coefficients of the shaping filter 414 are provided by a shaping coefficients calculation unit 419 which is supplied with the signal e[k] provided by the microphone 412. The signal e[k] from the microphone 412 is also supplied to an secondary path estimation unit comprising an adaptive filter core 420, an adaptive coefficient update unit 421, and a subtractor 422 arranged in the way illustrated in FIG. 8. However, instead of the white noise signal of the noise source 402 of FIG. 8 the signal provided by the shaping filter 414 is applied to the adaptive filter core 420 and the adaptive coefficient update unit 421. The coefficients of the adaptive filter core 420 provided by the adaptive coefficient update unit 421 are copied into the filter 424, creating a "shadow" filter in view of the adaptive filter core 420.

Another technique for estimating the secondary path is the broadband determination of the secondary path using additional source signals. Using an additional source signal, such as the signal from the radio, CD player or the like, the remote voice signal in a hands-free system, the navigation announcement signal, et cetera, broadband determination of the secondary path is possible in a classical manner, e.g., using an adaptive FIR filter. However, the difficulty in this case is primarily that it can never be ensured that the useful signal is available with sufficient amplitude or that it is present at all. The last aspect, in particular, naturally makes implementation impossible.

However, creating an ANC/MST system which operates correctly regardless of whether the vehicle sound system is turned on or is operated at sufficient volume, cannot rely upon the sole use of any particular source signal. Acting as one possible solution is a hybrid system, for example, in which, while the sound system is turned off or is operated at insufficient volume, the secondary path is determined in a manner which is yet to be stipulated, and otherwise the secondary path approximation method illustrated in FIG. 4 is used, for example.

Figure 10:
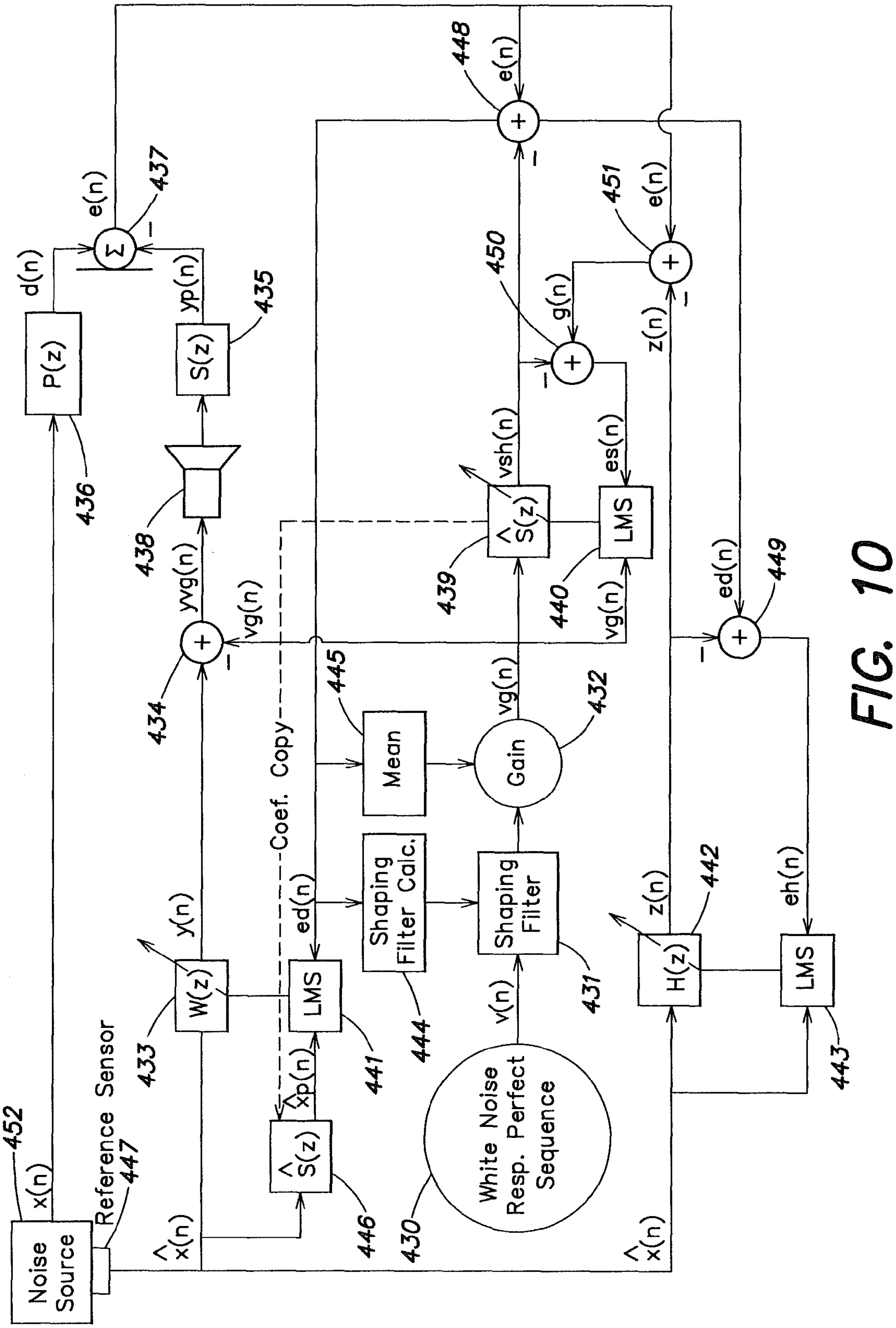
FIG. 10 is a block diagram illustration of a system comprising two mutually dependent sub-systems.

Another technique for estimating the secondary path is the extended broadband determination of the secondary path using additional measurement signals. The extended broadband determination of the secondary path using additional measurement signals which is shown in FIG. 10 is a mixture of the overall online modelling algorithm and system identification. As known from FIG. 9, this involves the secondary path being rated using a separately supplied broadband measurement signal (e.g., white noise, perfect sequence), with the measurement signal being matched to the spectrum of background noise or being coloured so that it has less of a disturbing effect. In the present example, a broadband measurement signal v[n] is provided by a white noise source 430.

The measurement signal v(n) coloured in this manner by a shaping filter 431 (in connection with a shaping coefficient update unit 444) is scaled on the basis of the energy of a currently prevailing ANC/MST error signal ed(n) in a gain unit 432 in connection with a mean unit 445. The gain unit provides an output signal vg(n) that is subtracted by a subtractor 434 from an anti-noise signal y(n) provided by an ANC/MST system 433. The ANC/MST system 433 cooperates with an LMS updater unit 441 and a shadow filter 446 having a transfer function $\hat{S}(z)$. A reference signal x(n) from a noise source 452 is filtered with the primary path 436 having a transfer function P(z) to provide a desired signal d[n]. Anti-noise signal y(n) from the ANC/MST system 433, and the measurement signal vg(n) are input to the subtractor to provide a difference signal yvg[n] to a loudspeaker 438 and desired signal d(n) resulting in a signal yp(n). It is apparent that even if the ANC/MST system 433 is operating perfectly (i.e., if the anti-noise signal has exactly the same amplitude as, but the opposite phase to the desired signal) the error microphone 437 still picks up the measurement signal vg(n), which disturbs the ANC/MST system 433 in its further adaptation.

The measurement signal vg(n) represents background or measurement noise. Since the measurement signal vg(n) can run only via the acoustic, secondary path 435 and the latter can be determined using the same, it is possible to counteract the disturbing influence of the measurement signal vg(n) on the ANC/MST system 433. This requires the measurement signal vg(n) first to be filtered by an approximated secondary path estimator 439 having a transfer function $\hat{S}(z)$ to provide estimated signal ush[n]. Subtractor 448 receives the estimated signal ush[n] and error signal e[n] and provides a difference signal ed[n]. If the approximated secondary path 439 matches the acoustic secondary path 435, this relieves the error signal e(n) of its measurement signal component which disturbs the ANC/MST system 433. The error signal ed(n) relieved of the disturbing measurement signal component is also used to generate the error signal e(n) for the overall modelling filter 442 (in connection with a LMS coefficient update unit 443) having the transfer function H(z). In this case, the error signal eh(n) is formed from the H(z)-filtered reference signal x(n)(or a substitute reference signal $\hat{x}(n)$ provided by a reference sensor 447 coupled with the noise source 452) resulting in a signal z(n), which is subtracted from the signal ed(n) by a subtractor 449. If ed(n) is free of the disturbing measurement signal component, i.e. if $$\hat{S}(z)=S(z),$$

then H(z) opposes the transfer function of the entire system, i.e.

$$H(z)\rightarrow P(z)-W(z)*S(z).$$

If H(z) is in a steady state, its output signal z(n) corresponds to the remainder of the reference signal x(n), which becomes zero if $$W(z)=P(z)/S(z).$$

This residual signal component which is contained in the error signal e(n) has the same disturbing influence on system identification as the measurement signal component previously had on the adaptation of the ANC/MST system 433. For this reason, the estimated residual signal z(n) is subtracted from the error signal e(n) by a subtractor 451. The subtractor 451 provides, for an ideal function, the error signal g(n) free of the residual signal component, and this error signal can now be used to form the error signal for the system identification es(n). This involves an output signal vsh(n) from the approximated secondary path filter ($\hat{S}(z)$) being subtracted from the error signal g(n) by a subtractor 451, to generate an error signal es(n) for approximation of the secondary path filter.

The system shown in FIG. 10 comprises two mutually dependent sub-systems. First, it comprises an ANC/MST filter 433 in connection with a LMS coefficient update unit 441 and secondly an adaptive filter 439 in connection with a LMS coefficient update unit 440 for system identification of the secondary path 435, which adaptive filter 439 provides the prerequisite for operation of the ANC/MST system 433.

Both sub-systems would actually need to run independently of one another in order to operate correctly. However, since they are operated in parallel they adversely affect one another. The influence that one sub-system exerts on the other can best be interpreted as measurement noise or as an increase in the background noise or as worsening of the SNR. The fact that the influence of one sub-system on the other can be simulated indicates that the system's disturbing effect can be respectively reduced. As a result, the Signal-to-Noise Ratio increases for each of the systems considered individually, that is, the mutual influence of both sub-systems is reduced, or the two sub-systems are made independent of one another.

Further, the system shown in FIG. 10 involves a coloured measurement signal being modulated using the energy in the currently prevailing ANC/MST error signal (gain unit 432), which has a stabilizing effect on the entire system. In this case, the ANC/MST error signal ed(n) can increase merely for two reasons, either if the reference signal x(n) is increasing or if the ANC/MST filter 433 is becoming unstable. If the adaptive filters have a sufficiently high convergence speed, the ANC/MST system 433 having the transfer function W(z) can become unstable only if the approximated secondary path filter 439 having the transfer function $\hat{S}(z)$ outside the stability phase range of [−90°, . . . , +90°]. As the estimated secondary path filter 439 differs from the correct value (e.g., owing to a rapid change in the room impulse response (RIR)) it needs to be redetermined as quickly as possible. However, to estimate the secondary path filter more quickly, the amplitude of the measurement signal needs to be increased.

Since the measurement signal's modulation is coupled directly to the error signal's energy, the measurement signal increases automatically when necessary and thus also stabilizes itself. In the event of a rise in the reference signal it is not necessary to increase the measurement signal, although even then it is not detrimental, since it is immediately returned again as soon as the ANC/MST filter has stabilized.

The system shown in FIG. 10 may be combined with the system shown in FIG. 4. This would merely require the measurement signal generator to be replaced by a useful signal source. This combination would, accordingly, benefit from the advantages cited above.

Figure 11:
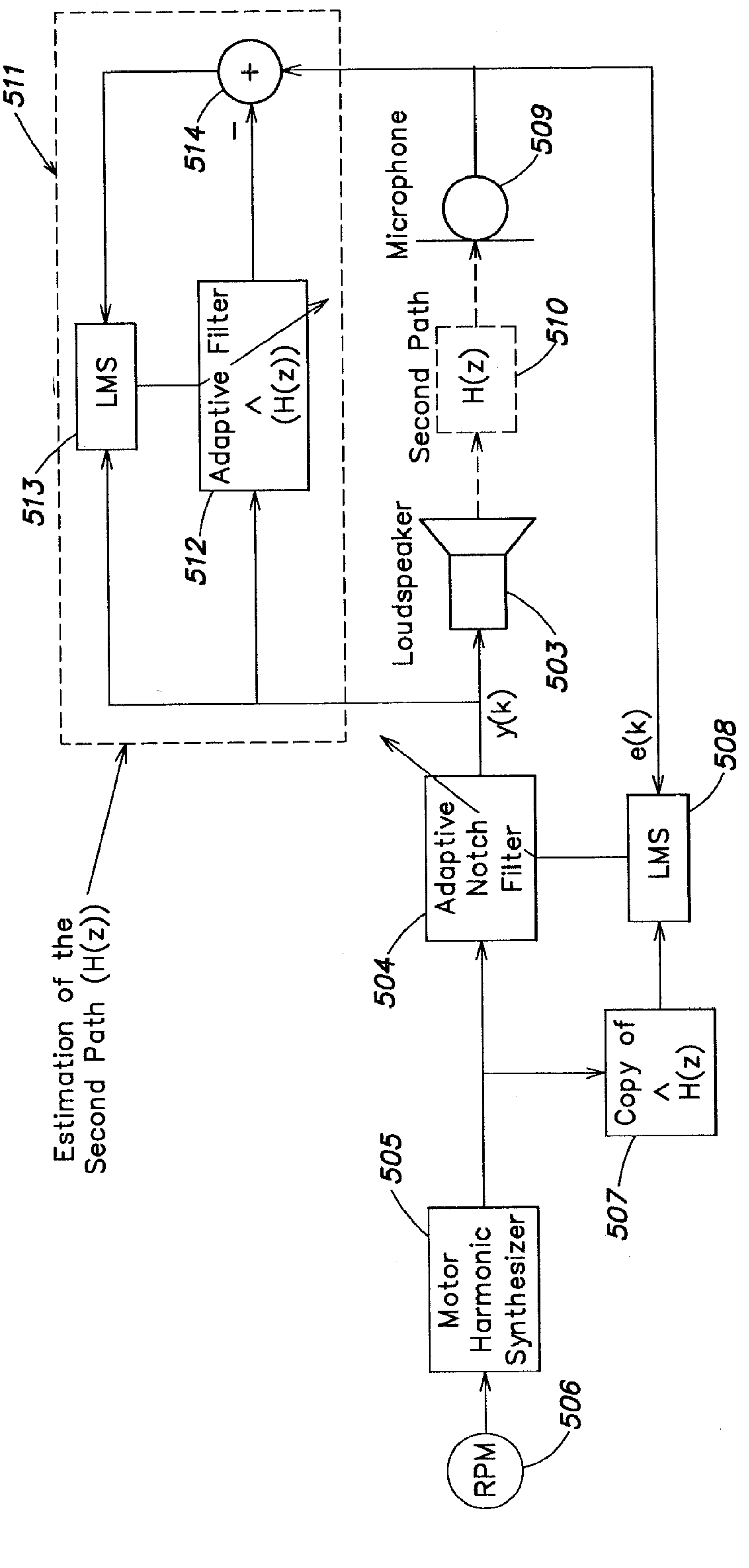
FIG. 11 is a block diagram illustration of a system for estimating the secondary path using radiated anti noise.

FIG. 11 illustrates the estimation of the secondary path using the radiated anti-noise. When using anti-noise to determine the secondary path, this is firstly excited only at the frequencies at which the reference signal is also available, which can be both broadband and narrowband, and secondly it is thus possible to dispense with an additionally supplied signal, regardless of whether it should be a measurement signal or a useful signal.

The problem in this case, however, is that it is not possible to estimate the secondary path if the ANC system is in the stable state and the approximation of the secondary path is still within the stability range in which the estimated phase of the unknown transfer function does not differ from the actual phase by more than [−90°, . . . , +90°]. In the stable state, the estimated acoustic secondary path ideally matches the actually present acoustic secondary path exactly. Therefore, there is perfect extinction at the relevant frequency point(s) and hence it is also not possible for a signal to be picked up by the error microphone at the relevant frequency points which may be used to determine the secondary path.

In such a system, the secondary path can be determined only if the ANC system gets out of step, because in this case a signal which is intended to be used to estimate the secondary path is available from the error microphone at the relevant frequency point. Consequently, such system starts to "pump", since the ANC system continually attempts to minimize the error signal and thereby extracts from itself the basis for determining the secondary path. However, this can be maintained only for as long as the approximation of the secondary path is within the stability range. If estimation of the secondary path leaves the stability range, the ANC system no longer works since the error signal can no longer be minimized and accordingly starts to increase. This process is maintained until the error signal having a sufficient amplitude long enough for further correct estimation of the secondary path, which returns the estimation to within the stability range again.

While there is no change either in the secondary path or in the frequency point at which approximation of the secondary path is needed, the system remains stable, otherwise it inevitably starts to pump to a greater or lesser extent. For applications in motor vehicles, the above system can be used if the amplitude of the pumping error signal at the frequency points in question can be kept small, which is achieved when adaptive filters with high convergence speeds are used.

An appropriate system is, for example, the one illustrated in FIG. 11. In the system of FIG. 11, a signal y[k] generated by an adaptive notch filter 504 is supplied to a loudspeaker 503. The adaptive notch filter 504 receives its input signal from an engine harmonic synthesizer 505, controlled by a rotational speed meter 506. The engine harmonic synthesizer 505 generates a noise signal as a function of the rotational speed of the engine. The noise signal largely corresponds to a noise signal picked up at the engine. The noise signal is also fed to a filter 507 which is also connected to the engine harmonic synthesizer 505. The signal at the output of the filter 507 is supplied to a control unit 508 that also receives a signal e[k] from a microphone 509.

The control unit 508 may employ the least mean square (LMS) algorithm and control the adaptive notch filter 504 in such a way that the difference between the signal serving as a reference signal at the output of the filter 507 is equal to the signal e(k). The acoustic link between the loudspeaker 503 and the microphone 509, referred to as the secondary path 510, has a specific transfer function H(z).

The transfer function $\hat{H}(z)$ of the filter 507 models the transfer function H(z) of the secondary path 510. To determine the transfer function H(z), an estimator unit 511 is connected between the output signal y[k] of the adaptive notch filter 504 and the output of the microphone 509. The estimator unit 111 comprises an adaptive filter 512 and a controller 513. The controller 513 may employ the least mean square (LMS) algorithm.

The control device 513 and the adaptive filter 512 receive the signal y[k]. The control device 513 also receives the output signal of a subtractor 514 indicative of the difference between the output e[k] from the microphone 509 and the output signal from the adaptive filter 512. In the adaptive filter 512, an (electrical) transfer function $\hat{H}(z)$ is then set to approximate the (acoustic) transfer function H(z) of the secondary path 510. The transfer function H'(z) of the adaptive filter 512 is copied into the filter 507, either on a regular basis or after each change. The filter 507 may, for example, have essentially the same structure as the filter 512, the filter 507 receiving the filter coefficients or filter parameters from the adaptive filter 512.

Figure 12:
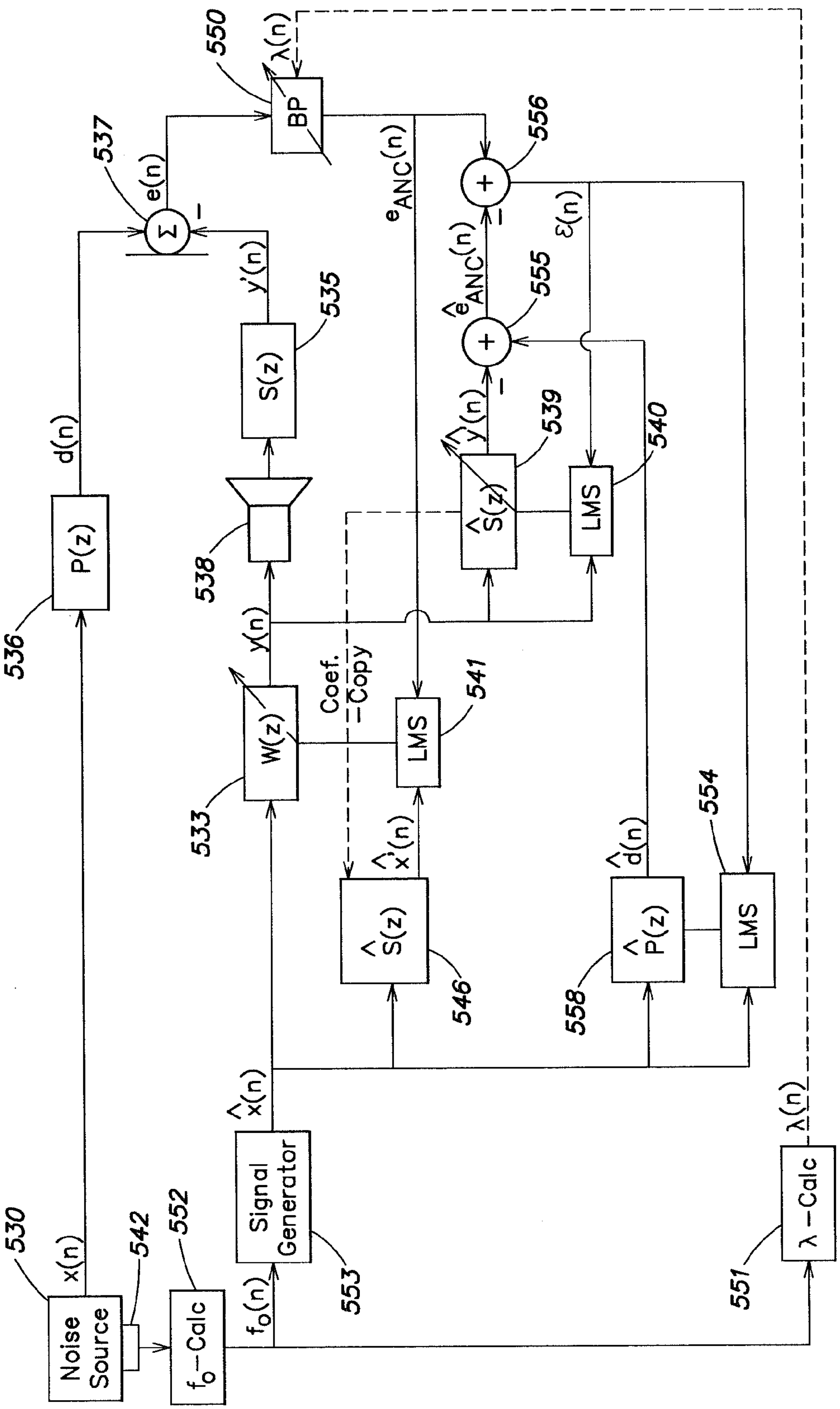
FIG. 12 is a block diagram illustration of a system for estimating the secondary path using overall online modelling.

The manner illustrated above of determining a transfer function without additional measurement signals is referred to generally as model-based estimation for simulating the actually existing system. In contrast, FIG. 12 illustrates an overall online modelling system. With the overall online modelling algorithm, the physically existing primary P(z) and secondary S(z) paths using a respective dedicated adaptive filter are simulated wherein the secondary path is rated using no separately supplied broadband measurement signal. In the present example, a broadband measurement signal is obtained from an anti-noise signal y(n) provided by an ANC/MST system 533 (in connection with a LMS updater unit 541 and a shadow filter 546 having a transfer function $\hat{S}(z)$) and is subsequently fed into a secondary (acoustic) path 535 having a transfer function S(z) via a secondary loudspeaker 538. A desired signal d(n), obtained from a reference signal x(n) by filtering with the primary path 536 having a transfer function P(z), needs to be extinguished. An error signal e(n) is picked up by an error microphone 537 and is composed of an anti-noise signal y'(n) and the desired signal d(n).

The error signal e(n) is fed into a controllable band pass filter 550 controlled by a control signal λ(n). The control signal λ(n) is provided by coefficient calculating unit 551 in connection with a fundamental calculating unit 552 and a reference sensor 542 connected to the noise source 530. The fundamental calculating unit 552 generates the fundamental signal $f_o(n)$ corresponding to the fundamental (first harmonic) of the signal supplied by the reference sensor 542 and is also fed into a signal generator 553 for providing the ANC/MST system 533 with the reference signal x^(n).

The signal x^(n) is also supplied to an adaptive filter 558 and a LMS updater unit 554 which controls the adaptive filter 558. The adaptive filter 558 has a transfer function P^(z) and outputs a signal d^(n) to a subtractor 555, which subtracts the signal y^(n) provided by the adaptive filter 539 resulting in a signal $e\hat{}_{ANC}(n)$. The signal $e\hat{}_{ANC}(n)$ is subtracted by a subtractor 556 from a signal $e_{ANC}(n)$ provided by the band pass filter 550. The signal $e_{ANC}(n)$ is further supplied to the LMS updater unit 541.

The ANC/MST filter 533 having the transfer function W(z) and the adaptive filters 558, 539 which are intended to simulate the primary P^(z) and secondary S^(z) paths are adjusted using the current error signal e(n). In this case, the LMS algorithm for the ANC/MST filter attempts to minimize the narrowband error signal $e_{ANC}(n)$, isolated from the error microphone signal, directly. While the two other LMS algorithms, which approximate P^(z) and S^(z), attempt, in contrast, to minimize the difference in the simulated, narrowband error signal ϵ[n]. However, in principle, the overall modelling algorithm suffers from the same problems as the algorithm presented in connection with FIG. 11, that is it starts to pump if the room impulse response (RIR) changes too quickly.

Besides the techniques presented in FIGS. 11 and 12, a series of other model-based estimation methods are known that attempt in other ways to simulate the entire, physical model. In this context, the publications in question are, by way of example: Tak Keung Yeung/Sze Fong Yau: "A Modified Overall On-Line Modelling Algorithm For The Feedforward Multiple-Point ANC System"; Hyoun-Suk Kim/Youngjin Park: "Unified-Error Filtered-X LMS Algorithm For On-Line Active Control Of Noise In Time-Varying Environments" and Paulo A. C. Lopes: "The Kalman Filter in Active Noise Control", Active 99. The latter provides the most promising starting point for further developments to ANC/MST systems with overall modelling algorithms in practice, since it has the best tracking characteristics for continuously changing systems. In case the estimation of the secondary path by the overall online modelling technique using Kalman filters is still too sluggish to follow rapid RIR changes, (e.g., for example caused by a rapidly changing RPM signal) the RPM signal may be input to a look-up table to facilitate the response to rapid changes. The way in which such a look-up table can be implemented will be discussed in more detail later.

The prior art also contains approaches which attempt to approximate only the phase response of the secondary path for narrowband ANC/MST systems directly or using a delay line. Particular publications which may be cited in this context are Seung-Man Lee, Cha-Hee Yoo, Dae-Hee Youn, Il-Whan Cha, "An Active Noise Control Algorithm For Controlling Multiple Sinusoids", Active 95, Newport Beach, Calif., USA, July 1995; and Sen M. Kuo, Kai M. Chung, "Secondary Path Delay Estimation Technique For Periodic Active Noise Control", Active 95, Newport Beach, Calif., USA, July 1995 which are as the ones cited before are incorporated herein by reference.

Figure 13:
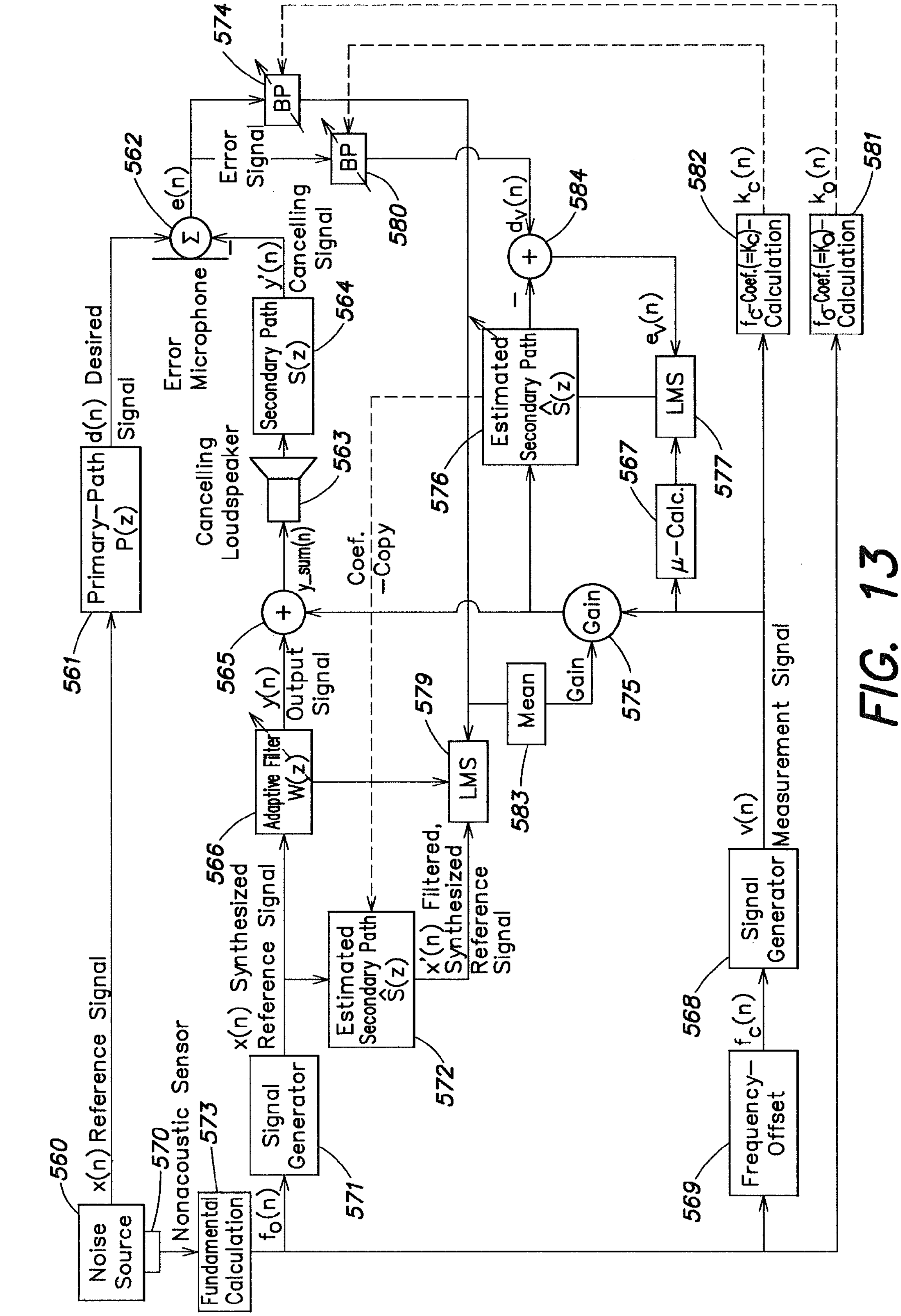
FIG. 13 is a block diagram illustration of a system for narrowband secondary path estimation using adaptive notch filters with copied coefficients.

FIG. 13 illustrates the narrowband determination of the secondary path using additional measurement signals. In the system of FIG. 13, a noise source 560 generates a reference signal x(n) which is transmitted via a primary path 561 having a transfer function P(z) to an error microphone 562. The error microphone 562 receives the filtered reference signal as desired signal d(n), and, a cancelling signal y'(n), and the error microphone provides an error signal e(n).

The cancelling signal y'(n) is output by a cancelling loudspeaker 563 via a secondary path 564 having a transfer function S(z). The loudspeaker 563 receives a signal y_sum(n) generated by an adder 565, and is the sum of a signal y(n) provided by an adaptive filter 566 and a signal provided by a gain unit 575. The gain unit 575 is supplied with a signal v(n) from a signal generator 568 that is controlled by signal $f_c(n)$ from a frequency offset unit 569. The frequency offset unit 569 is controlled by a fundamental calculation unit 573 that calculates a signal $f_o(n)$ representative for the fundamental in the reference signal x(n) from a signal provided by a non-acoustic sensor 570 coupled to the noise source 560.

The signal $f_o(n)$ is also fed into a signal generator 571 that generates a synthesized reference signal x(n) corresponding to the signal $f_o(n)$. The synthesized reference signal x(n) is supplied to the adaptive filter 566 and a filter 572 that estimates the secondary path S(z). The filter 572 generates a filtered synthesized reference signal x'(n) which is, as well as signal from a bandpass filter 574, supplied to a LMS updater unit 579 for the adaptive filter 566. The signal from the bandpass filter 574 is input to a mean unit 583 to control the gain of gain unit 575. The signal output by the gain unit 575 is supplied to the adder 565, and to an adaptive filter 576 for estimating the secondary path transfer function S(z). The adaptive filter 576 is controlled by a LMS updater unit 577 that processes the signal v(n) scaled by a scaler unit 567 and a signal $e_v(n)$ output by a subtractor 584. In a subtractor 584, the output signal from the adaptive filter 576 is subtracted from a signal dv(n) supplied by a bandpass filter 580. Bandpass filters 574, 580 are controlled by signals $K_o(n)$ and $K_c(n)$ respectively, which are obtained by coefficient calculating units 581, 582 from the signals $f_o(n)$ and v(n).

In the system shown in FIG. 13, the coefficients of the filter 572 for forming the estimated secondary path are copies of the coefficients of the adaptive filter 576. The system of FIG. 14 which is a modification of the system of FIG. 13, however, the coefficients of the filter 572 are provided by a look-up table 583 controlled by the signal fc(n) and the coefficients of the adaptive filter 576.

In case that no broadband determination of the secondary path is necessary, narrowband estimation of the unknown transfer function may be adequate, however some problems still remain. Again the unknown system transfer function is needed at the frequency point at which extinction is desired, which is not readily possible, as described above. However, if disregarding the demand for the secondary path to have to be determined exactly at the frequency point at which it would actually be necessary, namely at the point at which the extinction is effected by the ANC system, but instead taking an adjacent frequency point, then it is possible to rate the secondary path at that point even if the ANC system is in the stable state.

Although a certain error is accepted in the approximation of the secondary path, as long as this error is within the stability range the ANC system continues working properly, even if the adaptation speed of the ANC system falls as the discrepancy between the estimated secondary path and the target value rises. Basically, the error with which the secondary path is estimated becomes smaller the closer the (narrowband) measurement signal is to the desired frequency point. In addition, the error can be further reduced if, instead of the one, adjacent estimation of the secondary path close to the required frequency point, the average of two adjacent measurements is used, in which case one measurement signal needs to be below and the other needs to be above the desired frequency point.

Pinpoint determination of the secondary path can likewise, as with the ANC/MST filter, be carried out using an adaptive notch filter, which operates as a system identifier. The filter works better the smaller the disturbance is or the higher the signal-to-noise ratio (SNR) in the error signal. In order to deal with narrowband disturbances and measurement signals occurring, these signals are isolated from the error microphone signal likewise on a narrowband basis and supplied to the appropriate point, i.e. either to the ANC/MST filters or to the secondary path estimation (adaptive notch filter for system identification). As a result, the SNR is virtually increased, since parts of the error signal which do not contribute to the adaptation and have merely a disturbing effect are now masked out, which in turn has a positive effect on the quality of adaptation in the adaptive filters. High-quality bandpass filters used to cut out the appropriate components from the error signal need to follow the profile of the relevant harmonic, but in so doing may not change their bandwidth. For this reason, it is appropriate to design the bandpass filters as parametric filters in which just a single parameter can alter both the bandwidth and the cutoff frequency ($f_c$), the bandwidth needing to be kept constant, of course, which means that only the cutoff frequency parameter needs to be corrected using the desired frequency profile.

Such filter structure is, for example, a parametric filter whose core is an all-pass filter which comprises a two or four multiplier lattice filter and is additionally very robust towards quantization effects. The adaptation step size μ of the adaptive notch filter in the ANC/AST system can be used to set the system's bandwidth, which also applies to the adaptive notch filters for the secondary path estimation, but is of no significance in this case. In this case, it is found that the adaptation step size needs to be increased as the frequency rises, since otherwise changes in the secondary path cannot be followed quickly enough. However, this adaptation step size must not become too large, since otherwise the adaptive system identification filters can become unstable.

Figure 14:
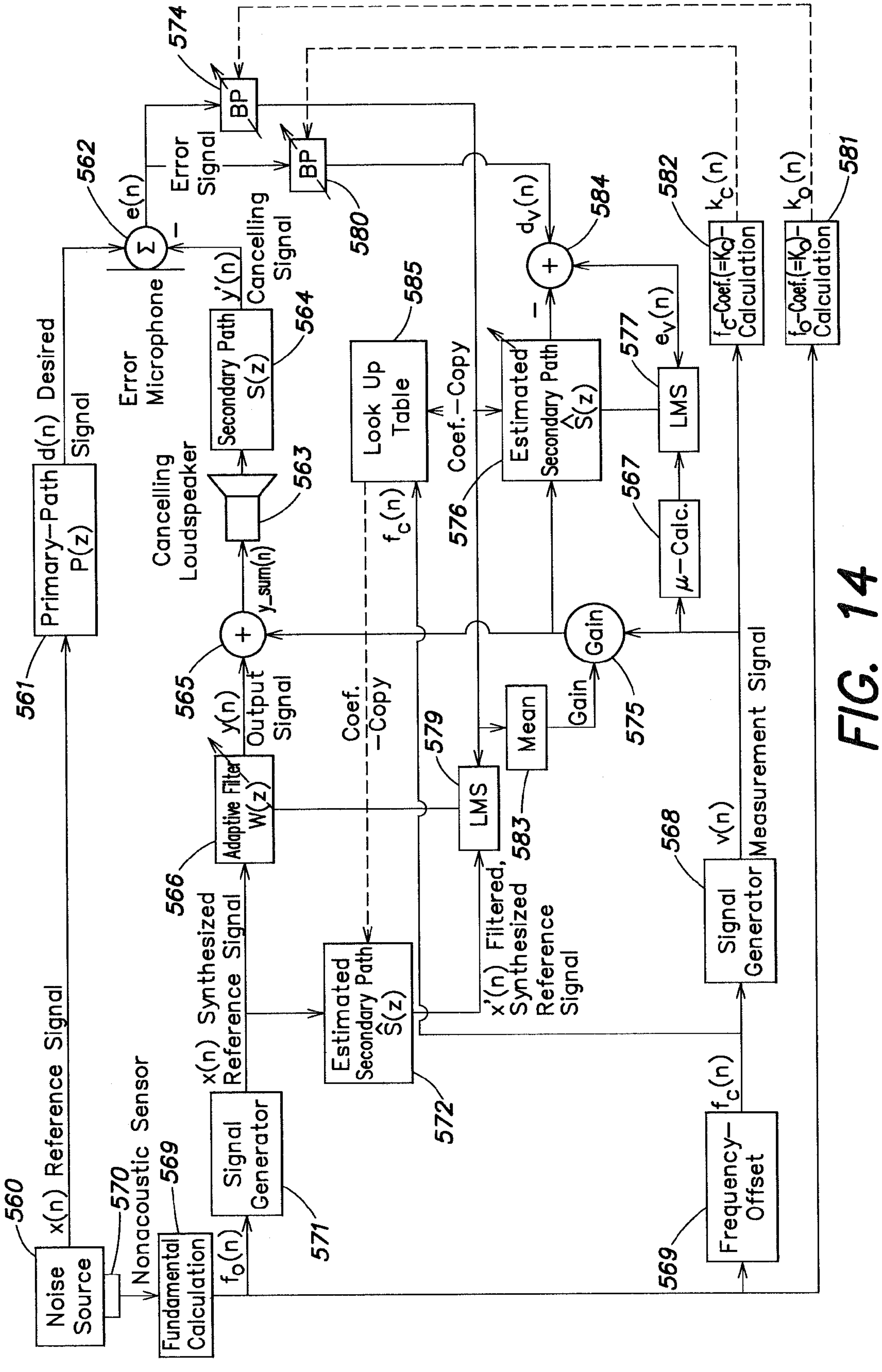
FIG. 14 is a block diagram illustration of a system for narrowband secondary path estimation using adaptive notch filters with coefficients from a look-up table.

For this reason, in the system shown in FIG. 14, the adaptation step size μ of the adaptive notch filters for the secondary path estimation is corrected, using a prescribed function (e.g., realized in a look-up table 583), on the basis of the current RPM or the desired, resultant frequency of the harmonic. One problem which has already been discussed for the broadband determination of the secondary path is that the measurement signals must not be audible or at least not have any disturbing effect within the zone of silence throughout the entire procedure. Since the narrowband noise which is to be suppressed normally stands out clearly from the background noise, a masking trail is formed in their immediate vicinity, with measurement signals which are there below the threshold of the masking trail being able to be concealed well without being able to be detected in the process. The problem in this case is that of altering the amplitude of the measurement signals such that they remain below this masking threshold, which is dependent on the noise signal. An indicator which may be used for such modulation in this regard is the energy of the narrowband ANC/MST error signal, which may change its level on the basis of the current success of adaptation, the minimum of the level being determined by the current background noise level. While the ANC/MST system has not yet stabilized, the noise level and hence the masking threshold are normally high, which means that the measurement signals are modulated with a high amplitude and hence the secondary path can be estimated quickly.

As the success of adaptation increases, which cannot actually occur until the secondary path is available with sufficient accuracy, the error signal is minimized, which means that the amplitude of the measurement signals is also reduced, with the amplitudes now not being returned to almost zero but rather being able to fall just to a value which is dependent on the current prevailing background noise. For this reason, it is still possible to rate the secondary path, even in the stable state, but this takes up more time on account of the now reduced amplitude. In practice, although a certain pump effect likewise starts for rapid changes in the room impulse response for this reason, it turns out to be much weaker than in the system shown in FIG. 14. Such rapid changes in the RIR are normally not to be expected, but still need to be able to be handled, since the RPM signal in the narrowband ANC/MST system under consideration can change very rapidly, which, from the point of view of the secondary path estimation, has the same effect as a rapidly changing RIR, since in this case a fast scan takes place over the frequency, and the secondary path normally does not have a constant transfer function, but rather this transfer function changes greatly over the frequency. In the case of extremely rapid changes in the RPM signal, the inadequate accuracy of the approximated secondary path therefore means that there may be a brief rise in the error signal, which has a negative effect on the performance of the ANC/MST system. Although broadband estimation of the secondary path would alleviate this problem, it is not easy to implement, as discussed above.

However, single frequency points at which the secondary path has already been determined may be stored and, when the same frequency is swept again, to use this saved value as the new starting value for further adaptation. As a result, even rapid changes in the RPM signal may be followed, but it is possible to react to RIR changes only slowly. Which of the two systems carries more weight in practice is dependent on the respective application, but both have their strengths and weaknesses, as already mentioned. Using the frequency spacing in the look-up table, it is possible to vary the respective solution between the advantages and drawbacks. If the frequency resolution is high, the system can react quickly to RIR changes, although it does not work as quickly as the system shown in FIG. 14, but rapid changes in the RPM signal do not have such a disturbing effect on the secondary path estimation. The finer the frequency resolution in the look-up table is, the more accurate the broadband estimation of the secondary path is, although the system thus becomes increasingly sluggish if the RIR changes. In this case too, non-linear splitting of the frequency into frequency groups within the look-up table may have a positive effect on the performance, in a similar manner to the case of warped filters.

Figure 15:
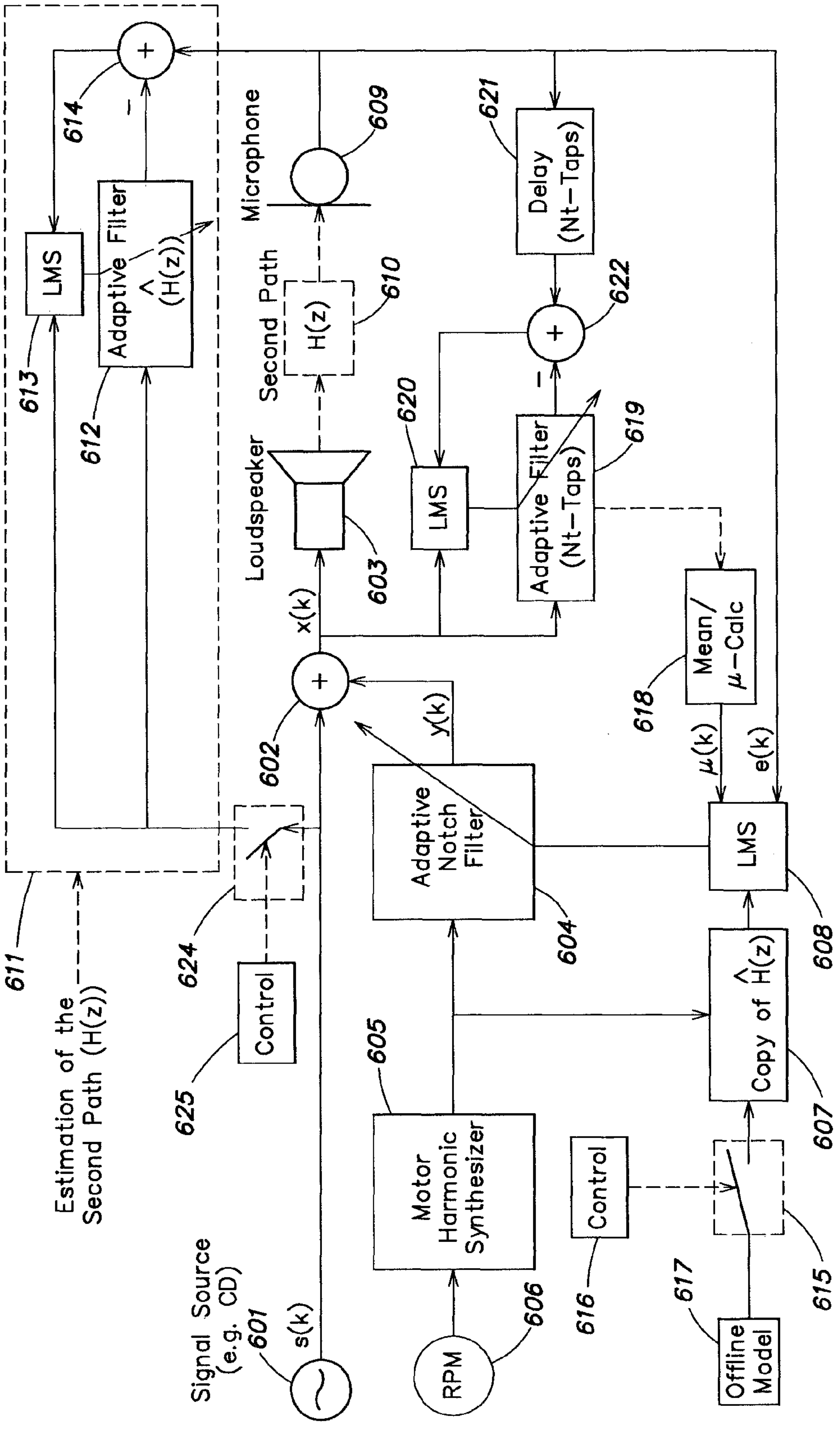
FIG. 15 is a block diagram illustration of a system for broadband determination of the secondary path using the source signals from which the current secondary path model is derived in a narrowband manner.

FIG. 15 illustrates a broadband determination of the secondary path using the source signal, an offline model, and an adaptive adaptation step size. In the system of FIG. 15, a signal s(k) of a signal source 601 is supplied to a loudspeaker 603 via an adder 602. The signal which is generated at the output of the adder 602 is obtained from the sum of the signal s(k) and a signal y(k) from an adaptive notch filter 604. The adaptive notch filter 604 receives a signal from an engine harmonic synthesizer 605, which is controlled by a rotational speed meter 606.

The engine harmonic synthesizer 605 generates a noise signal as a function of the rotational speed of the engine, the noise signal largely corresponding to a noise signal which is tapped at the engine. This noise signal is fed to a filter 607 that is also connected to the engine harmonic synthesizer 605. The transfer function of the filter 607 may be controlled from the outside. The signal at the output of the filter 607 is supplied to a control unit 608 that also receives a signal e(k) of a microphone 609.

The control unit 608 operates in the present embodiment according to the least mean square (LMS) algorithm and controls the adaptive notch filter 604 in such a way that the difference between the signal, serving as a reference signal, at the output of the filter 607 is equal to the signal e(k) which is actually picked up at the output of the microphone 609. The acoustic link between the loudspeaker 603 and the microphone 609, referred to as the secondary path 610, has a specific transfer function H(z).

The transfer function H'(z) of the filter 607 is intended to model the transfer function H(z) of the secondary path 610. In order to determine the transfer function H(z), an estimator unit 611 is connected to the signal source 601 and the output of the microphone 609. The estimator unit 611 comprises an adaptive filter 612 and a LMS updater unit 613 for the adaptive filter 612 which are both connected via a switch 624 controlled by a control unit 625. The LMS updater unit 613 uses the least mean square (LMS) algorithm.

The LMS updater unit 613 receives the signal s(k) from the signal source 601 as does the adaptive filter 612. The LMS updater unit 613 also receives the output signal of a subtractor 614 whose inputs are connected to the adaptive filter 612 and the microphone 609 and which subtracts the output signal of the adaptive filter 612 from the output signal of the microphone 609. In the adaptive filter 612, an (electrical) transfer function H'(z) is subsequently set and it is essentially approximated to the (acoustic) transfer function H(z) of the secondary path 610.

The transfer function H'(z) of the adaptive filter 612 is copied into the filter 607, either on a regular basis or after each change. For this purpose, the filter 607 may, for example, have essentially the same structure as the filter 612, the filter 607 receiving the filter coefficients or filter parameters from the adaptive filter 612.

In the system of FIG. 15, the LMS updater unit 608 is supplied with "enhanced" signals which are, on one hand, an additional signal μ[k] and, on the other hand, the output signal from the filter 607 which is processed differently as in the system of FIG. 4. In the present system, the LMS updater unit 608 is supplied with a signal from an offline modelling unit 617 via a switch 615, which is controlled by a switch control unit 616. The signal μ[k] is calculated by a calculation unit 618 from the coefficients of an adaptive filter 619. The adaptive filter 619, as well as an LMS updater unit 620 for controlling the adaptive filter 619, is supplied with the signal x[k] from the adder 602. The signal output by the adaptive filter 619 is subtracted by a subtractor 622 from the signal output of the error microphone 609 which has previously been delayed by a delay unit 621.

There are ANC systems that do not require any explicit simulation of the secondary path, reference generally being made to "perturbation algorithms". These systems no longer operate on the basis of the FXLMS algorithm, but rather attempt to produce an ANC/MST system in another way, for example by using neural networks, genetic algorithms or by solving "perturbation equations", with the "simultaneous equations technique" having been found to be most promising in practice. In this context, particular reference is made to the publications by Kensaku Fujii/Yoshikisa Nakatani, Mitsuji Muneyasu, "A New Active Sinusoidal Noise Control System Using the Simultaneous Equations Technique", IEICE Transactions On Fundamentals, Volume E85-A, No. 8, August 2002.

The problem of online secondary path estimation is essential in the implementation of ANC/MST systems in practice. Particularly in car applications, which are a kind of "worst case" for ANC/MST systems because rapid, dynamics-rich changes in the secondary path can be expected in this case, sufficiently fast and accurate approximation of the secondary path in real time is indispensable if the overall system is intended to operate in stable fashion with a certain level of quality. In this case, different approaches to solutions to the problem have been found most appropriate.

It is possible to use perturbation algorithms to be able to dispense with the simulation of the secondary path entirely, these algorithms leading away from the classical FXLMS algorithm and attempting to master the ANC problem in an entirely new manner. Their principle generally also works in practice, but is distinguished by a low convergence speed, which is not appropriate for some applications.

Another approach to a solution is the overall online modelling algorithm, which attempts to approximate the entire, really existing acoustic system artificially, without the use of separate measurement signals. In our case, this means that it attempts to simulate both the primary path and the secondary path in real time, using just the error signal. Although it has a sufficiently high conversion speed, it suffers from the problem of ambiguity, since it attempts to solve an equation with two unknowns for which there are known to be an infinitely large number of solutions, but only one solution leads to the actual existing primary and secondary paths. If the ANC filter changes over time, the symmetry condition is broken, which means that under certain conditions it is still possible to identify the primary and secondary paths separately from one another.

A further option for solving the problem of online secondary path estimation is to rate the secondary path. To this end, system identification requires the supply of a separate measurement signal that must not be correlated to the reference signal; although this increases the noise level at the location at which the error signal is picked up, it is unavoidable. For this reason, attempts are made to keep the measurement signal as small as possible, with a number of approaches being put into practice in this context. First, attempts are made to make system identification as independent as possible of the primary noise signal correlated to the reference signal, which is why broadband determination of the secondary path involves the use of an additional adaptive filter which simulates the primary path, which is then used to filter the reference signal and means that the influence of the primary error signal can be subtracted from the overall error signal and hence the latter's influence on the system identification, i.e. on the determination of the secondary path, is eliminated. This method, which can be referred to as a kind of mixture of system identification and overall online modelling algorithm, can be used to reduce the amplitude of the measurement signal considerably. With narrowband determination of the secondary path, the primary path does not need to be explicitly simulated. In this case, it is sufficient for the narrowband measurement signals to be isolated from the overall error signal, so that system identification can no longer be obstructed by the primary noise signals.

Another way to reduce the disturbing influence of the measurement signal, particularly in the case of broadband determination of the secondary path, is to adapt or colour the measurement signal, for which primarily white noise is used, on the basis of the currently prevailing profile of the power density spectrum of the background noise. To estimate the secondary path with sufficient accuracy and speed, the measurement signal needs to be available in highly modulated form, which means that it sometimes becomes clearly audible. This effect cannot be avoided, but appears to a significantly greater and more disturbing effect with broadband system identification, owing to the higher total energy in the measurement signal. In our case, we are mainly concerned with narrowband disturbances coming from the engine. The signals sometimes stand out clearly from the background noise spectrum and accordingly bring about masking in their immediate frequency surroundings, which masking can be used to conceal narrowband measurement signals. These signals can then be reproduced with sufficient amplitude without them having a particularly disturbing effect at the location of the error sensor.

Another problem that is eliminated by modulating the measurement signal using the currently prevailing error signal, beneath whose masking curve the signal is concealed, is that of robustness. In this case, the following relationship applies: if the (narrowband) error signal rises, the reason for this can be either that the noise signal level has increased or that the system is starting to become unstable. In the latter case, the secondary path needs to be quickly re-estimated with sufficient precision to stabilize the system again. The fact that the measurement signal is coupled to the amplitude of the error signal means that the measurement signal also rises to the same extent as the error signal in both of the scenarios outlined above. In the first case, that is to say when the noise signal itself rises, a rise in the measurement signal would admittedly not be necessary, but also does not matter, since the larger measurement signal continues to be concealed by the error signal, which is likewise becoming larger. In the case of system stabilization, the measurement signal needs to rise in order to return the secondary path, which is no longer satisfying the stability condition, quickly to the range in which the ANC/MST system can operate stably again. If the secondary path is subjected to narrowband determination, the system identification needs to be able to follow transfer functions which are changing extremely rapidly.

In our example, it must be able to follow system changes at the speed of the RPM signal. For it to be possible to react to rapidly changing transfer functions, adaptive filters need to be used which have a high convergence speed. There are many solution options in the literature, the two best known probably being the RLS algorithm and the Kalman filter, but these are very complex to implement. For narrowband applications, it is possible to use the adaptive notch filter, which has low implementation complexity and also the necessary convergence speed. For this reason, this form of adaptive filter is in many applications preferred.

In principle, ANC/MST systems suffer from the fact that there is no "genuine" reference signal. Although it is possible to produce even broadband ANC/MST systems using well-placed reference sensors, with the coherence function between the reference signal and the error signal providing information about the quality of the overall system, such positions are generally difficult to find or do not actually exist. Another problem that would need to be overcome when using a reference microphone, for example, is "feedback", that is, feedback loops from the secondary loudspeaker to the reference microphone. For this reason, one normally limits oneself in practice, as in our example, to a synthesized reference signal which is normally not available in broadband form.

Figure 16:
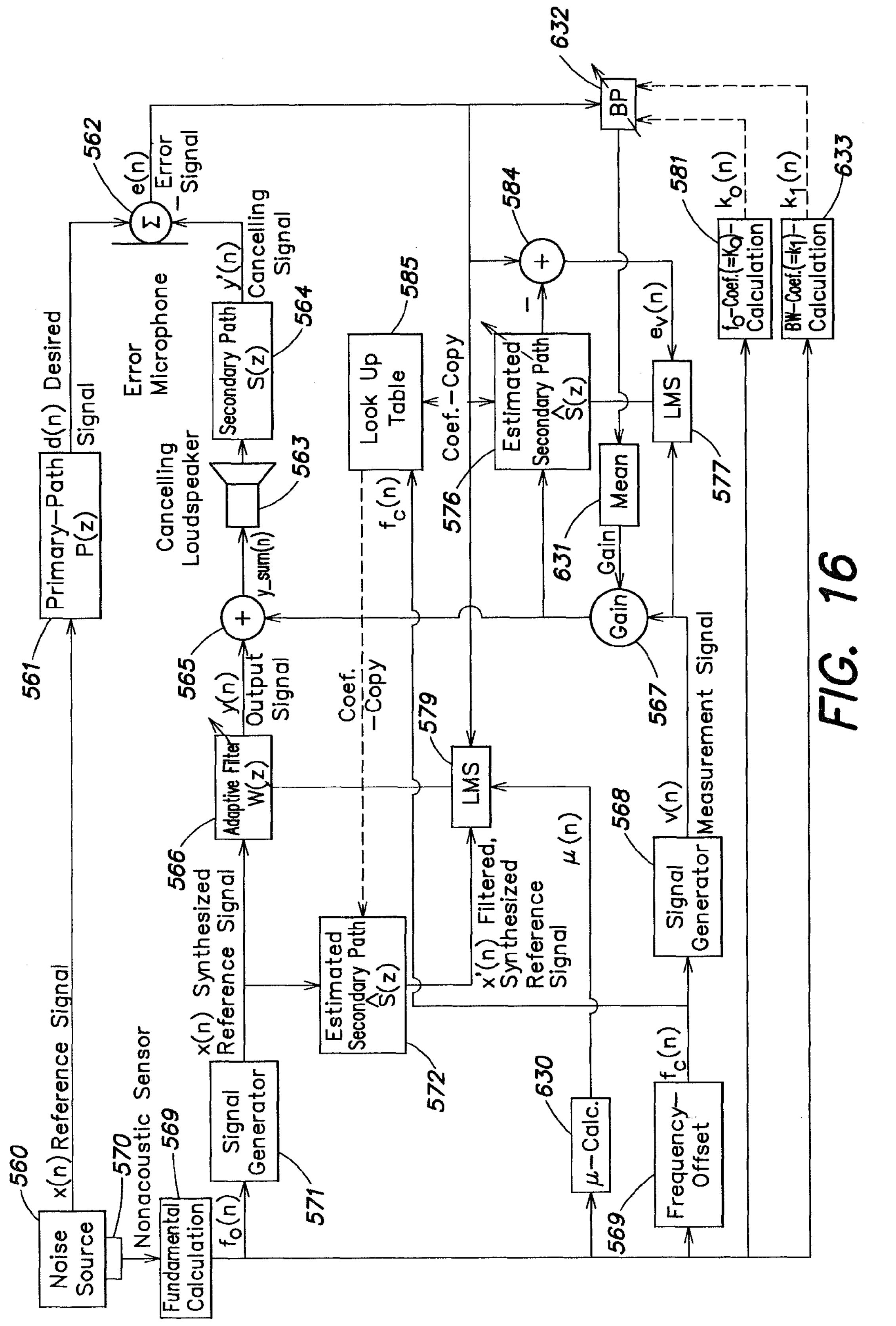
FIG. 16 is a block diagram illustration of an alternative system for the system of FIG. 14.

A good compromise between performance and costs is the system of FIG. 16 which is similar to the system of FIG. 14. However, the system of FIG. 16 differs from the system of FIG. 14 as follows: the LMS updater unit 579 receives an additional signal μ(n) which is calculated by a calculation unit 630 from the signal $f_0(n)$. In turn, the calculation unit 567 of FIG. 14 has been omitted so that the LMS updater unit 577 receives the signal v(n) directly from the signal generator 568. In contrast to FIG. 14, the path comprising the mean unit 583 is omitted in FIG. 16. Instead, a path comprising a mean unit 631 is introduced for controlling the gain unit 567, which is connected between the gain unit 567 and a bandpass filter 632; the bandpass filter 632 replaces the bandpass filters 574 and 580 of FIG. 14 such that the error signal e(n) from the microphone 562 is supplied directly to the LMS updater unit 579 and the subtractor 584 while the error signal e(n) is supplied to the mean unit 631 via the bandpass filter 632. The bandpass filter 632 is controlled by two signals $K_0(n)$ and $K_1(n)$ wherein the signal $K_0(n)$ is provided by the calculation unit 581 as already illustrated in FIG. 14 (582) and the signal $K_1(n)$ is provided by a calculation unit 633 for calculating the bandwidth coefficient $K_1$ from the signal $f_0(n)$. In general, there are many ways to calculate an unknown transfer function from the input and output signals. Since, in the present case, the transfer function may change with time an adaptive approximation is a promising way.

Figure 17:
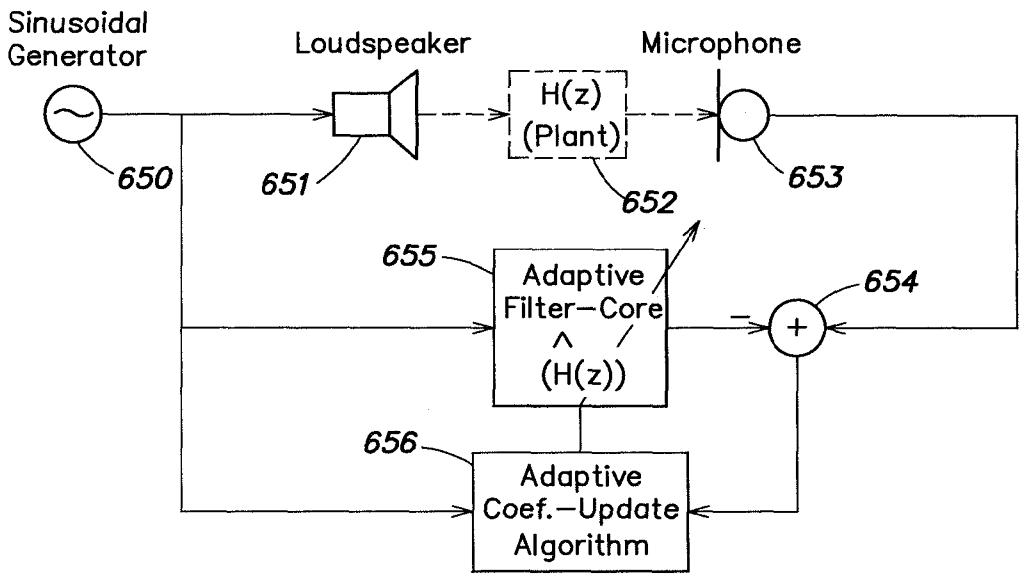
FIG. 17 is a block diagram illustration of a general arrangement for a pointwise estimation of an unknown transfer function.

FIG. 17 illustrates a general arrangement for estimating pointwise a transfer function H(z) changing with time. A generator 650 generates a sinusoidal signal which is supplied to a loudspeaker 651 transmitting a corresponding acoustic signal via a transfer path 652 having a transfer function H(z) to a microphone 653. A signal picked up by a microphone 653 is fed into a subtractor 654 which subtracts the signal provided by the microphone 653 from a signal provided by an adaptive filter core 655. The adaptive filter core 655 receiving the signal from the generator 650 is controlled by an adaptive coefficient updater unit 656 which receives the signals provided by the generator 650.

Preferably, simple and stable adaptive non-recursive filters having a low convergence speed are used for this purpose as, for example, adaptive filters working according to the LMS, NLMS, FXLMS algorithms and the like. A good choice in this respect is an adaptive FIR filter working according to the LMS algorithm.

Figure 18:
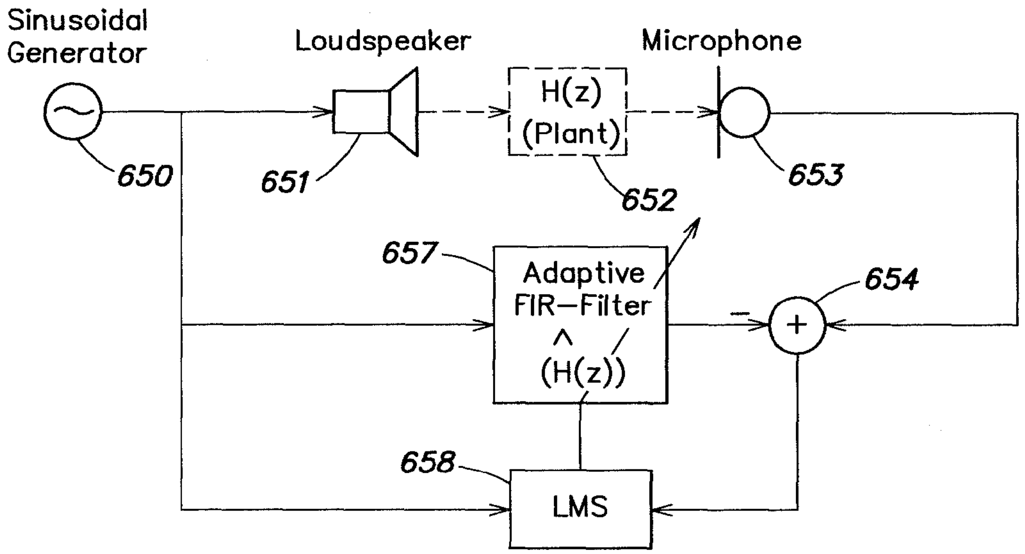
FIG. 18 is a block diagram illustration of the arrangement of FIG. 17 comprising a LMS estimator for estimating the filter coefficients.

FIG. 18 is an alternative embodiment of the arrangement shown in FIG. 17 wherein the adaptive filter core 655 and the adaptive coefficient updater unit 656 of FIG. 17 are realized by an adaptive FIR filter core 657 and a LMS updater unit 658 respectively. In case different resolutions in different frequency bands are useful, down-sampling in connection with filters of different filter lengths may be applied, with $$\Delta f = f_s / L,$$

wherein Δf is the frequency resolution in [Hz], $f_s$ is the sampling frequency in [Hz] and L is the FIR filter length.

Figure 19:
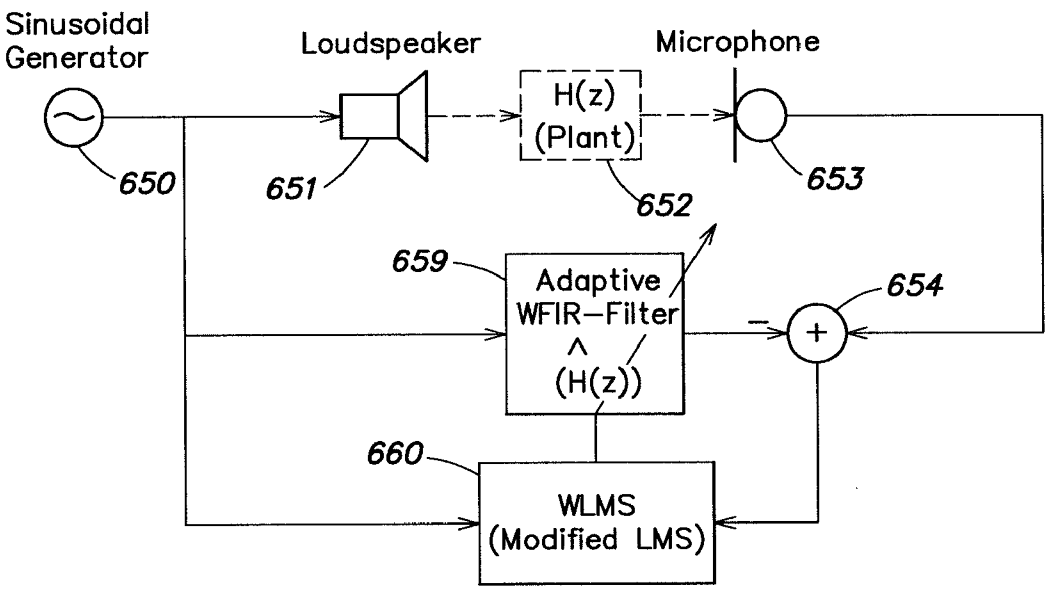
FIG. 19 is a block diagram illustration of the arrangement of FIG. 17 using a warped LMS estimator for estimating the filter coefficients of a warped filter.

Alternatively, an adaptive warped FIR filter (WFIR filter) may be used which has the advantage of realizing different frequency resolutions at different frequencies in one single filter, and thus having a relatively short filter length. FIG. 19 is an alternative for the arrangement shown in FIG. 17 wherein the adaptive filter core 655 and the adaptive coefficient updater unit 656 of FIG. 17 are realized by an adaptive warped FIR filter core 659 and a warped LMS updater unit 660 respectively. The frequency depending frequency resolution of warped filters is advantageous in particular if the frequency resolution of the human ear is to be modelled (in Bark or Mel scale).

However, the frequency range may be limited to an upper limit of $fc_o$=2 kHz depending on the number of harmonics to be considered so that the resulting sampling frequency of two times the Nyquist frequency ($2*fc_o$) equal to $f_s$~4 kHz is used. In this case warped filters may not be needed since in view of the reduced sampling frequency the filter lengths of common filters such as common FIR filters may be short enough and their frequency resolution may be high enough.

If dealing only with single harmonics having narrow bandwidths, it may be sufficient to evaluate the unknown transfer function just at those single discrete frequency points. The advantage is that there is no need for down-sampling in order to increase the frequency resolution, and no need for large memories with the filtering in the adaptive filter core which performs the approximation of the room impulse response (RIR). To calculate an unknown RIR at a single frequency point a sinusoidal signal having a frequency equal to the frequency point to be examined may be supplied to the system to be investigated in order to form an ANC system, for example an adaptive notch filter.

Figure 20:
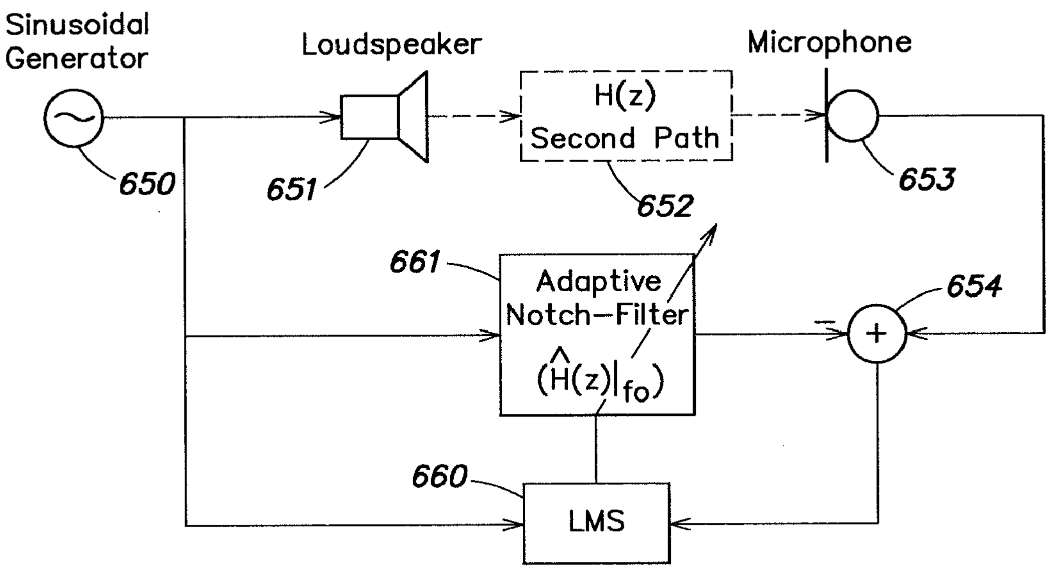
FIG. 20 is a block diagram illustration of an arrangement of FIG. 17 comprising an adaptive notch filter.

FIG. 20 illustrates such a system which is an alternative for the arrangement shown in FIG. 17, where the adaptive filter core 655 and the adaptive coefficient updater unit 656 of FIG.

17 are realized by an adaptive notch filter core 661 and a LMS updater unit 660, respectively. In case the unknown system is, for example, the interior of a vehicle, listeners located in the interior would hear, in addition to a desired signal (e.g., music from a compact disc, radio etc.) an undesirable sinusoidal signal. In order to improve this situation, the sinusoidal signal may be only transmitted at certain times, for example, shortly after switching the system on, or with intensities which make the signals not audible to humans. Since the human ear comprises a dynamic range of 120 dB, the sinusoidal signal needs to have a very low intensity (amplitude) to be not audible or at least not inconvenient to humans. However, in terms of inconvenience, the human ear is more sensitive to narrowband harmonic signals in contrast to broadband noise signals. Further, signals having such little intensities cause adaptive filter algorithms to work improperly, especially in view of real time processing and quantisizing effects. Another option to improve sound quality for the listener is to use spectral masking effects of the human ear caused by desired signals and background noise for "hiding" the sinusoidal signal but the option is very costly and has some drawbacks.

A more simple option showing even better results is to use the signal source providing the desired signal for calculating the RIR. Restricting the frequency range to lower frequencies may further improve the performance of the system. At lower frequencies ($f \leqq 1$ kHz), such systems perform satisfactory since music and speech statistically have their highest energy levels at lower frequencies. However, in order to work at the frequency points of interest, the signals at the particular frequency points have to be extracted from the desired signal. According to the teachings of Fourier, the desired signal is the sum of different sinusoidal signals having different intensities (amplitudes) varying over time. By extracting one or more sinusoidal signals from the sum at the frequency of interest signals are generated which may form the basis for an estimation of an unknown transfer function (RIR) at discrete frequency points. Extracting the sinusoidal signals from the sum may be performed by a so-called Goertzel algorithm or Goertzel filter.

The Goertzel algorithm links Discrete Fourier Transformation (DFT) to a complex first order IIR filter. By a complex filter coefficient $W_N^{-k}$ the k'-th spectral component can be selected, which is available at the IIR filter output after N samples. In order to avoid complex multiplying and adding a second order IIR filter may be used instead of a first order IIR filter. In such second order IIR filter, the recursive real part of the filter is passed N times and, after that, the N-th sample is supplied to the first order FIR part of the filter which is passed only once providing a complex output signal split into a real and an imaginary signal. The accuracy of the k-th spectral component depends on N so that, in terms of a Fast Fourier Transformation (FFT), N is comparable to a filter length.

Starting with a Discrete Fourier Transformation (DFT)

$$X(k) = \sum_{i=0}^{N-1} x(i) * W_N^{i*k},\ k = 0, 1, \ldots, N-1$$

wherein:

$$W_N = e^{-j*\frac{2*\pi}{N}}$$

$$W_N^{i*k} = e^{-j*\frac{2*\pi}{N}*i*k}$$

$$\Rightarrow W_N^{k*N} = e^{-j*\frac{2*\pi}{N}*k*N} = e^{-j*(2*\pi*k)} = 1$$

and interpreting Discrete Fourier Transformation (DFT) as a filter leads to

*DFT*:

$$X(k) = W_N^{-k*N} * \sum_{i=0}^{N-1} x(i) * W_N^{i*k} = \sum_{i=0}^{N-1} x(i) * W_N^{-k*(N-i)}$$

Convolution (Filtering):

$$y_k(n) = x(n) \otimes h_k(n) = \sum_{i=0}^{N-1} x(i) * h(n-i) = \sum_{i=0}^{N-1} x(i) * W_N^{-k(n-i)},$$

wherein: $h_k(n) = W_N^{-k*n} * u(n)$ $$\Rightarrow X(k) = y_k(N)$$

Interpreting the Goertzel algorithm as a first order complex IIR filter leads to:

$$h_k(n) \circ\!-\!\bullet H_k(z) \Rightarrow$$

$$H_k(z) = \frac{1}{1 - W_N^{-k} z^{-1}}$$

$$y_k(n) = W_N^{-k} * y_k(n-1) + x(n),$$

with: $y_k(-1) = 0$

Figure 21:
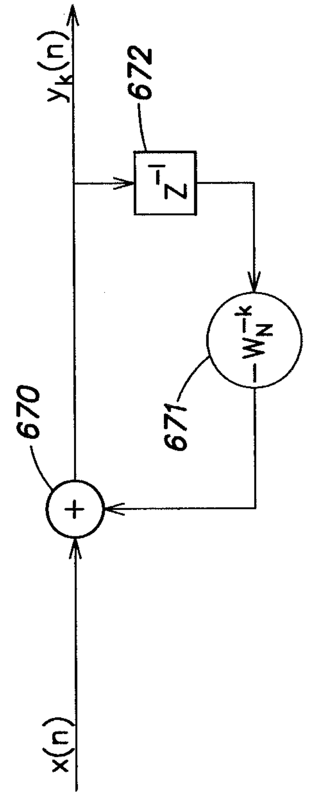
FIG. 21 illustrates a first order IIR filter implementing the Goertzel algorithm.

FIG. 21 illustrates the Goertzel algorithm applied to a first order complex IIR filter where a signal x(n) is supplied to an adder 670, which receives also a signal from a coefficient unit 671 being connected upstream to a delay unit 672. The delay unit 672 is supplied with the output signal $y_k(n)$ of the IIR filter that is provided by the adder 670.

As an alternative, the Goertzel algorithm may also be interpreted as second order IIR filter, in which:

$$H_k(z) = \frac{1}{1 - W_N^{-k} z^{-1}} * \frac{1 - W_N^{k} z^{-1}}{1 - W_N^{k} z^{-1}} \Rightarrow$$

$$H_k(z) = \frac{1 - W_N^{k} z^{-1}}{1 - 2*\cos\left(\frac{2*\pi*k}{N}\right) z^{-1} + z^{-2}}$$

Differential Equations:

$$v_k(n) = 2*\cos\left(\frac{2*\pi*k}{N}\right) * v_k(n-1) - v_k(n-2) + x(n)$$

$$y_k(n) = v_k(n) - W_N^{k} * v_k(n-1)$$

Figure 22:
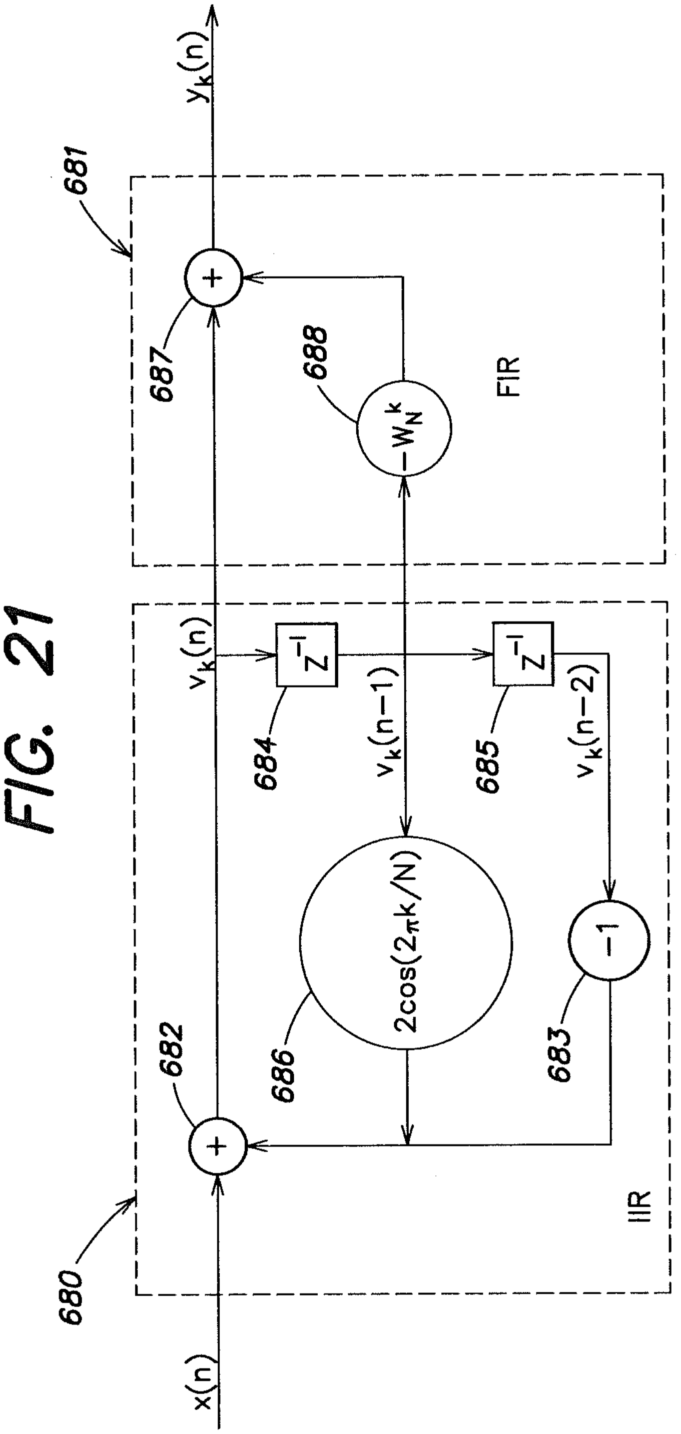
FIG. 22 illustrates a second order IIR filter implementing the Goertzel algorithm.

FIG. 22 is a second order IIR filter of direct form II implementing the Goertzel algorithm for analysing an input signal x(n) sampled with 44.1 kHz ($f_a$) at 100 Hz ($f_0$) with 10 Hz ($\Delta f$) frequency resolution. Such a filter is called a Goertzel filter and comprises an IIR sub-filter 680 and a FIR sub-filter 681.

The IIR sub-filter 680 receives the input signal x(n) which is provided to an adder 682 providing a signal $v_k(n)$. The adder 682 also receives a signal $v_k(n-2)$ via an inverter 683 from a delay chain comprising two delay units 684, 685 in series. The delay chain is supplied with the signal $v_k(n)$. Further, the delay chain is tapped between the two delay elements 684, 685 for providing a signal $v_k(n-1)$. The signal $v_k(n-1)$ is also supplied to the adder 682 via a coefficient element 686 with a coefficient $2\cos(2\lambda k/N)$.

The FIR sub-filter 681 comprises an adder 687 and a coefficient element 688 with a coefficient $-W_N^K$ where the adder 687 receives the signal $v_k(n)$ directly and the signal $v_k(n-1)$ via coefficient element 688 for providing an output signal $y_k(n)$.

To calculate the filter coefficients $a_1$, $b_1$ of the second order IIR filter of direct form II (Goertzel filter) from $f_0$=100 Hz, $f_s$=44.1 kHz, Δf=10 Hz, N is calculated according to $$N=f_s/\Delta f=4410.$$

This means that after N samples the Goertzel filter has to be initialised again, so that every state is deleted.

$$k=f_0/\Delta f=10.$$

This means that the 10th spectral line has to be calculated since the frequency resolution is Δf=10 Hz and the frequency point in question is $f_0$=100 Hz $$2\cos(2\pi k/N)=2\cos(2\pi f_0/f_s)=2\cos(0.0014247585)=1.999998687$$

$$W_N^k=-e^{-i(2\pi k/N)}=-\cos(0.0014247585)+j\sin(0.0014247585)=-0.999999343+j0.0011458619$$

The Goertzel filter provides orthogonal sinusoidal signals that processed in the subsequent system for estimating the RIR at the particular frequency point as far as notch filters are concerned.

Figure 23:
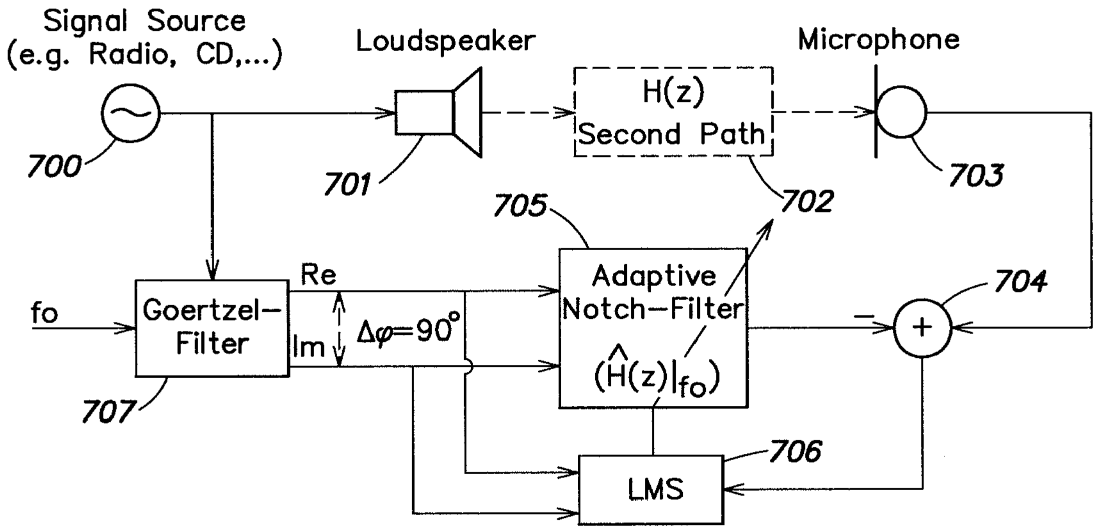
FIG. 23 is a block diagram illustration of an arrangement for estimating an unknown transfer function at a discrete frequency point utilizing the source signal and a Goertzel filter in combination with an adaptive notch filter.

FIG. 23 illustrates an arrangement for estimating a transfer function H(z) at a discrete frequency point by a Goertzel filter and a notch filter. A signal source 700 (e.g., radio, CD etc.) generates a desired signal which is supplied to a loudspeaker 701 transmitting a corresponding acoustic signal via a transfer path 702 having a transfer function H(z) to a microphone 703. A signal picked up by a microphone 703 is fed into a subtractor 704 which subtracts the signal provided by the microphone 703 from a signal provided by an adaptive filter core 705. The adaptive filter core 705 receiving a complex signal from a Goertzel filter 707 is controlled by an adaptive coefficient updater unit 706 that receives the signals provided by the Goertzel filter 707. The Goertzel filter is supplied with a parameter representative for the frequency $f_0$ and the signal from the signal source 700. In the system of FIG. 20, the adaptive filter core 705 and the adaptive coefficient updater unit 706 are realized by an adaptive notch filter core 661 and a LMS updater unit 660, respectively. However, a system having a Goertzel filter close to the input for extracting a sinusoidal signal from a useful signal and an adaptive notch filter for estimating the RIR at a certain frequency point may experience some amplitude fluctuations of the sinusoidal signal.

Figure 24:
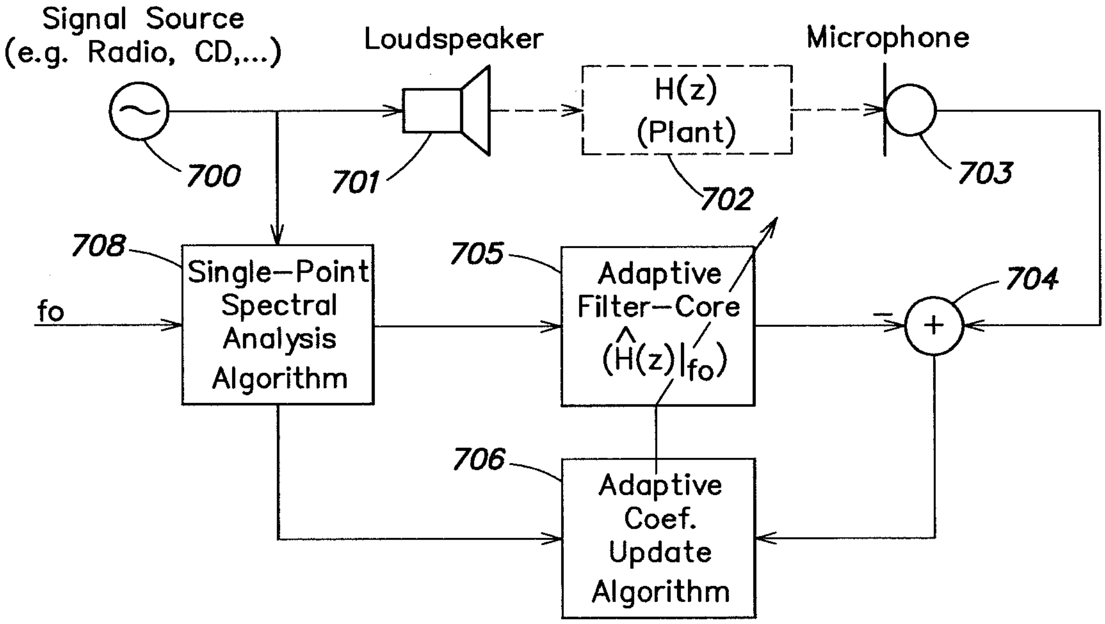
FIG. 24 is a block diagram illustration of the generalized arrangement of FIG. 23.

It should be noted that instead of a notch filter any other type of adaptive filter is applicable, for example, adaptive FIR filters, adaptive WFIR filter and the like. Even if Goertzel filters are easy to implement, the system described with reference to FIG. 23 is not restricted to Goertzel filters. Alternatively, Discrete Fourier Transformation (DFT), Fast Fourier Transformation (FFT), the Reinsch algorithm, or other known methods may be used. FIG. 24 illustrates such system using any kind of adaptive filter and a one-point frequency analysis unit 708 instead of the Goertzel filter 707 of FIG. 23.

Figure 25:
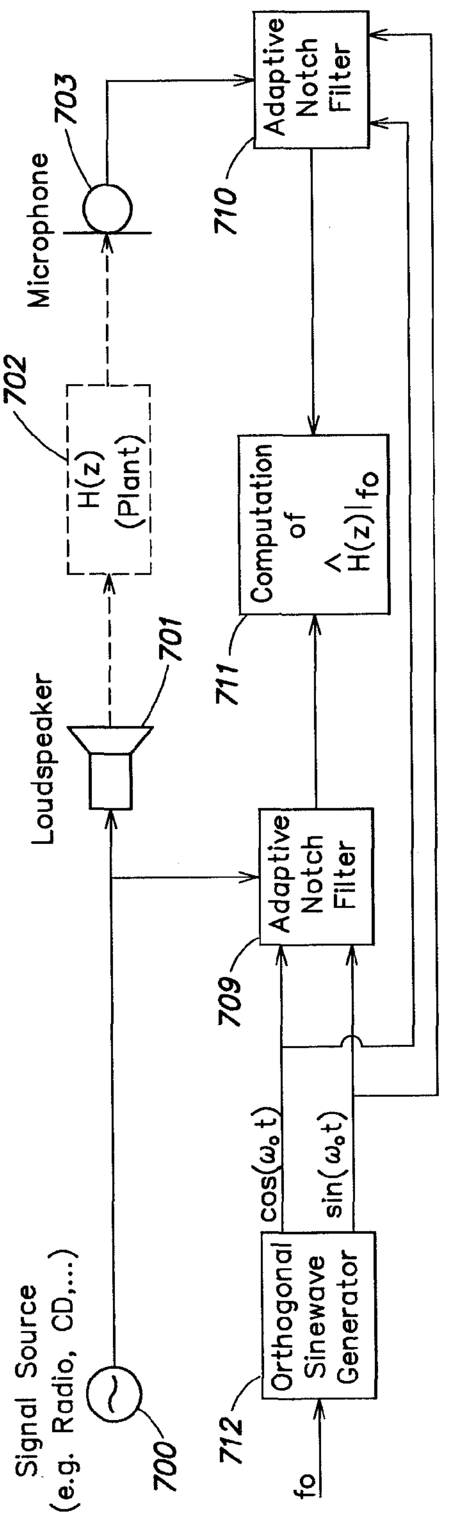
FIG. 25 is block diagram illustration of a general arrangement for estimating an unknown transfer function at a discrete source signal frequency point using adaptive notch filter in combination with the source signal.
Figure 26:
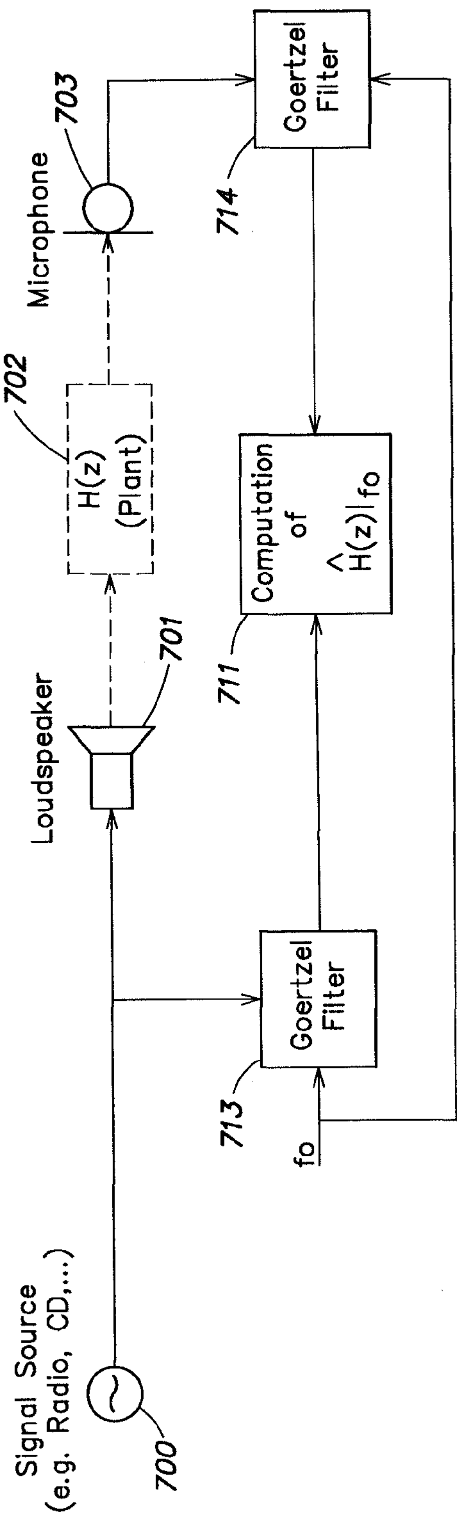
FIG. 26 is a block diagram illustration of an alternative arrangement of the system illustrated in FIG. 25 using Goertzel filters in combination with the source signal.

With reference to FIG. 25, a stable system for estimating the transfer function at a discrete frequency point comprises an adaptive filter having two notch filters 709, 710, a secondary path computation unit 711 receiving signals from the two notch filters 709, 710, and a orthogonal sinusoidal wave generator 712. The two notch filters 709, 710, in turn, receive signals from the orthogonal sinusoidal wave generator 712 with the frequency $f_0$ and from the signal supplied to the loudspeaker 701 or provided by the microphone 703 respectively. To further improve the performance of the system, the two notch filters 709, 710 of FIG. 25 may be replaced by two Goertzel filters 713, 714 as illustrated in FIG. 26. In this case no orthogonal sinusoidal wave generator 712 is required. The parameter representing $f_0$ is fed directly into the two Goertzel filters 713, 714 which provide the orthogonal spectral component.

In general, a transfer function H(z) is the relation of the input signal X(z) and output signal Y(z), wherein:

$$H(z)=\frac{Y(z)}{X(z)}$$

The estimation of the transfer function at any frequency point $f_0$ ($=H(z)|_{f0}$) is important for being provided to the secondary path filter of the MST/ANC algorithm. The signal required in the secondary path filter for the transfer function at this particular frequency point needs to be an orthogonal signal having a real and an imaginary component in order to allow scaling and filtering.

Figure 27:
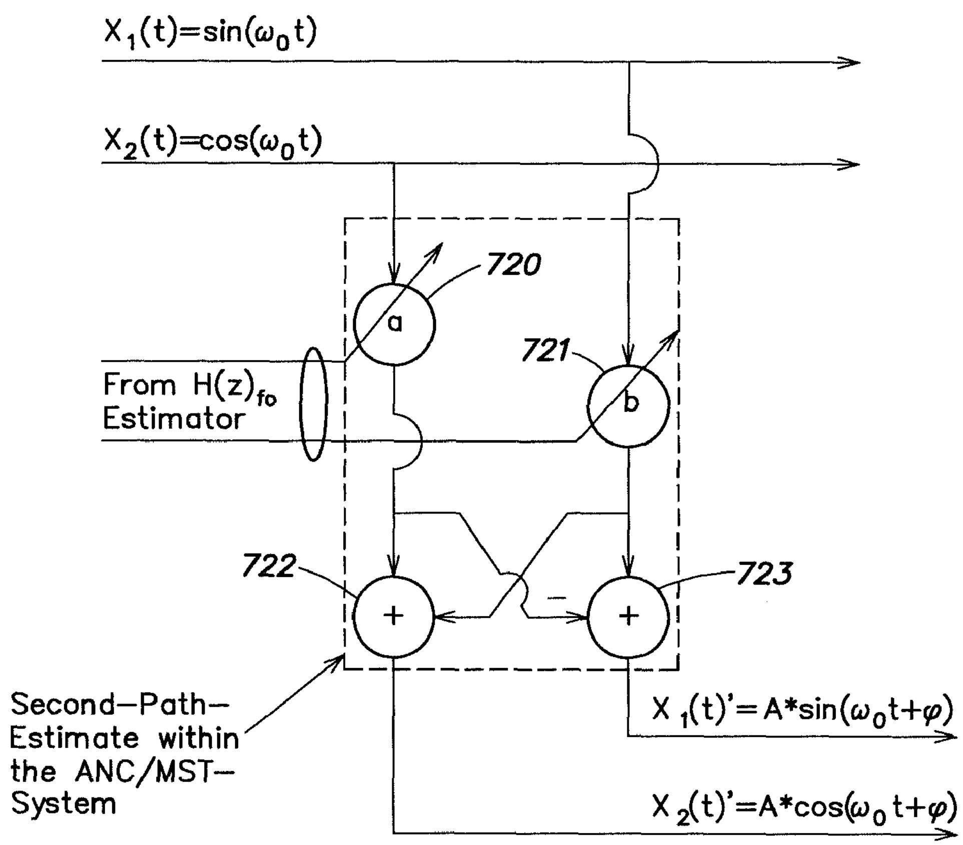
FIG. 27 illustrates a system implementing an estimated transfer function at a discrete frequency point.

FIG. 27 illustrates a unit of an ANC/MST system using the estimated transfer function at the frequency point $f_0$($=H(z)|_{f0}$). A complex input signal having the signal components $x_1(t)=\sin(\omega_0 t)$ and $x_2(t)=\cos(\omega_0 t)$ are fed into two scaling units 720 and 721 wherein the scaling unit 720 receiving the signal component $x_1(t)=\sin(\omega_0 t)$ comprises a scaling factor a and the scaling unit 721 receiving the signal component $x_2(t)=\cos(\omega_0 t)$ comprises a scaling factor b. The signals output by the scaling unit 720, 721 crosswise added and subtracted by an adder 722 and a subtractor 723 which output signal components $x_1(t)'=A\cdot\sin(\omega_0 t+\phi)$ and $x_2(t)'=A\cdot\cos(\omega_0 t+\phi)$ of a complex output signal.

The scaling factors a ($=\mathrm{Re}(H(z)|_{f0})$) and b ($=\mathrm{Im}(H(z)|_{f0})$) can be obtained from the complex input signal and the complex output signal where the complex input signal comprises the signal components ReIn, ImIn and the complex output signal comprises the signal components ReOut, ImOut.

Calculation of the magnitude (value) of the input signal:

$$\mathrm{RhoIn}=\sqrt{\mathrm{ReIn}^2+\mathrm{ImIn}^2}$$

Calculation of the magnitude (value) of the output signal:

$$\mathrm{RhoOut}=\sqrt{\mathrm{ReOut}^2+\mathrm{ImOut}^2}$$

Calculation of the phase of the input signal:

$$ThetaIn=\arctan\left(\frac{\mathrm{Im\ In}}{\mathrm{Re\ In}}\right)$$

Calculation of the phase of the output signal:

$$ThetaOut=\arctan\left(\frac{\mathrm{Im\ Out}}{\mathrm{Re\ Out}}\right)$$

Calculation of the value of the transfer function:

$$|H(z)| = \frac{RhoOut}{RhoIn}$$

Calculation of the phase of the transfer function ($\angle H(z)$):

$$\angle H(z) = 2\cdot\Pi + \text{ThetaOut} - \text{ThetaIn}$$

Calculation of the real and imaginary components of the transfer function (a=Re(H(z)) and b=Im(H(z))) from the value (|H(z)|) and the phase ($\angle H(z)$):

$$a = \mathrm{Re}(H(z)) = |H(z)|\cdot\cos(\angle H(z))$$

$$b = \mathrm{Im}(H(z)) = |H(z)|\cdot\sin(\angle H(z))$$

As the above considerations illustrate, the computation of the scaling factors a and b is not easy to be implemented. An option easier to implement is to use a notch filter which changes the complex amplitude of the input signal until value and phase of the input signal are identical to the output signal. In this case, the scaling factors a and b of the notch filter represent the real and the imaginary part of the transfer function of the system to be investigated at the particular frequency point.

Figure 28:
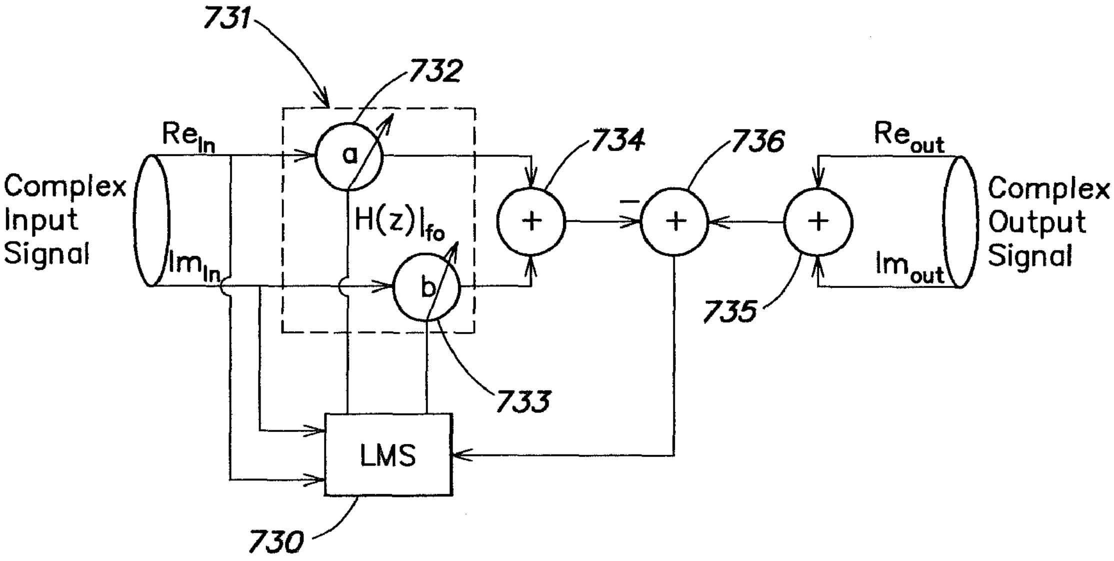
FIG. 28 illustrates an adaptive notch-filter for estimating the real part and the imaginary part of an unknown transfer function.

FIG. 28 is an adaptive notch filter for estimating the real and imaginary parts of an unknown transfer function from input and output signals by calculating the scaling factors a and b. A complex input signal having a real signal component $Re_{In}$ and an imaginary signal component $Im_{In}$ are fed into a LMS updater unit 730 and notch filter 731; the notch filter 731 comprising a scaling unit 732 receiving the signal component $Re_{In}$ and a scaling unit 733 receiving the signal component $Im_{In}$, both of which are controlled by the LMS updater unit 730. The signals output by the scaling units 732, 733 are added by an adder 734 and subtracted from a signal from an adder 735 by a subtractor 736. The adder 735 receives a real signal component $Re_{Out}$ and an imaginary signal component $Im_{Out}$ of a complex output signal. The signal provided by the subtractor 736 is supplied to the LMS updater unit 730. As can easily be seen, the adaptive notch filter provides without further computation the scaling factors for the MST/ANC system representing the approximation of the secondary path.

In MST systems, beside the orthogonal input signals also the error correction signal needs to be filtered with the approximated secondary path transfer function. Since the signals may not be available in an orthogonal form but only in analytical form, a Hilbert transformer may be needed to generate an orthogonal (complex) signal from the analytical signal. As only one single frequency point is considered, the Hilbert transformer needs to have a −90° phase shift only at this particular point which is much easier to implement than a so-called broadband Hilbert transformer.

Figure 29:
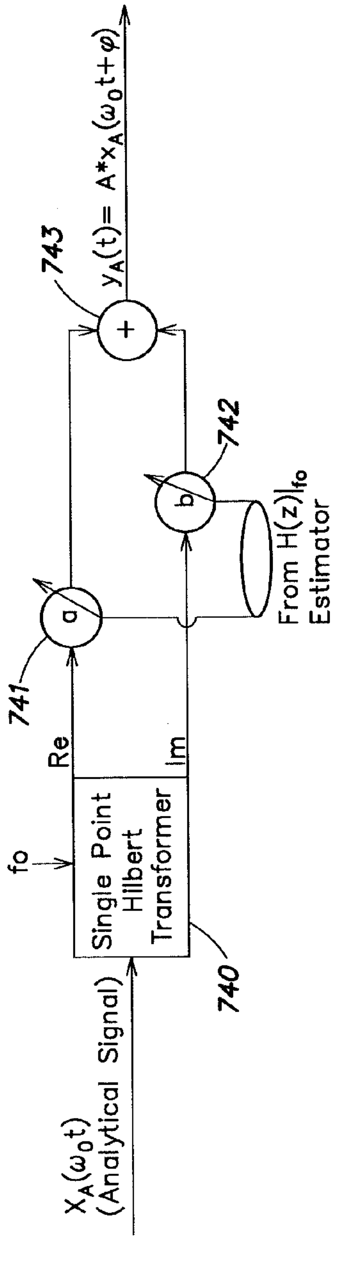
FIG. 29 illustrates an arrangement for filtering an analytical signal in an ANC/MST system.

FIG. 29 illustrates the filtering of an analytical signal $x_A(\omega_0 t)$ in an ANC/MST system by a Hilbert transformer and the scaling factors a and b at a frequency point $f_0$. The signal $x_A(\omega_0 t)$ is supplied to a Hilbert transformer 740 which splits the signal $x_A(\omega_0 t)$ into a real signal component Re and an imaginary signal component Im. The real signal component Re is fed into a scaling unit 741 (scaling factor a) and the imaginary signal component Im is fed into a scaling unit 742 (scaling factor b) wherein both scaling units 741, 742 are controlled from secondary path estimation unit (not shown in the drawings). The signals output by the scaling units 741, 742 are added by an adder 743 resulting in a signal $y_A(t)=A\cdot x_A(\omega_0 t+\phi)$.

Figure 30:
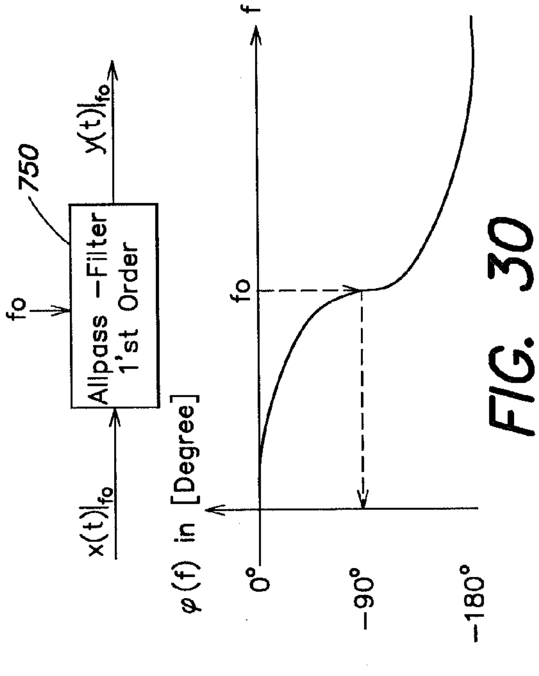
FIG. 30 illustrates a known single-point Hilbert transformer utilizing a first order allpass filter.

A simple way to implement a single-point Hilbert transformer is to use a first order allpass filter, the cutoff frequency $f_c$ of which is adjusted to the frequency point $f_0$ in question since a first order allpass filter has a −90° phase shift at its cutoff frequency $f_c$. FIG. 30 shows such single point Hilbert transformer 750 and the dependency of its phase shift $\phi(f)$ versus frequency f.

Figure 31:
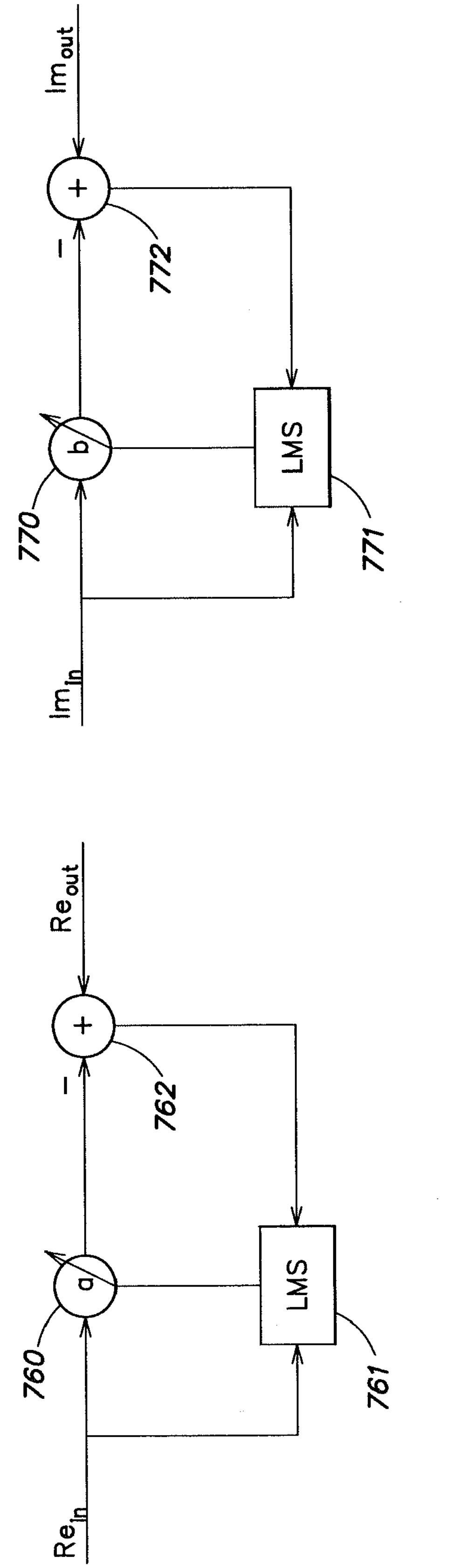
FIG. 31 illustrates an implementation of a one-point LMS algorithm.

Another option for computing the scaling factors a and b of an unknown system which is established, for example by Goertzel filters or adaptive notch filters, from its (complex) input and output signals is to implement a one-point LMS algorithm as illustrated in FIG. 31. The real signal component $Re_{In}$ and the imaginary signal component $Im_{In}$ of a complex input signal are supplied to scaling unit 760 and 770 respectively, and to an LMS updater unit 761 and 771 respectively for controlling the scaling units 760 and 770. The signals output by the scaling units 760 and 770 are subtracted from the respective output signals $Re_{Out}$ and $Im_{Out}$ by a subtractor 762 and 772 respectively and fed into the LMS updater unit 761 and 771 respectively.

Basically, the RIR of a vehicle interior causes an excessive damping at lower frequencies (f<1 kHz) resulting in a significant reduction of the signal level of the microphone signal in comparison to the loudspeaker signal at these frequencies. Goertzel filters may react to small signals that can cause total failures of the algorithm for estimating an unknown RIR at single frequency points. In this regard, it is very supportive to implement an automatic gain control (AGC) whereby many AGC systems are applicable.

Figure 32:
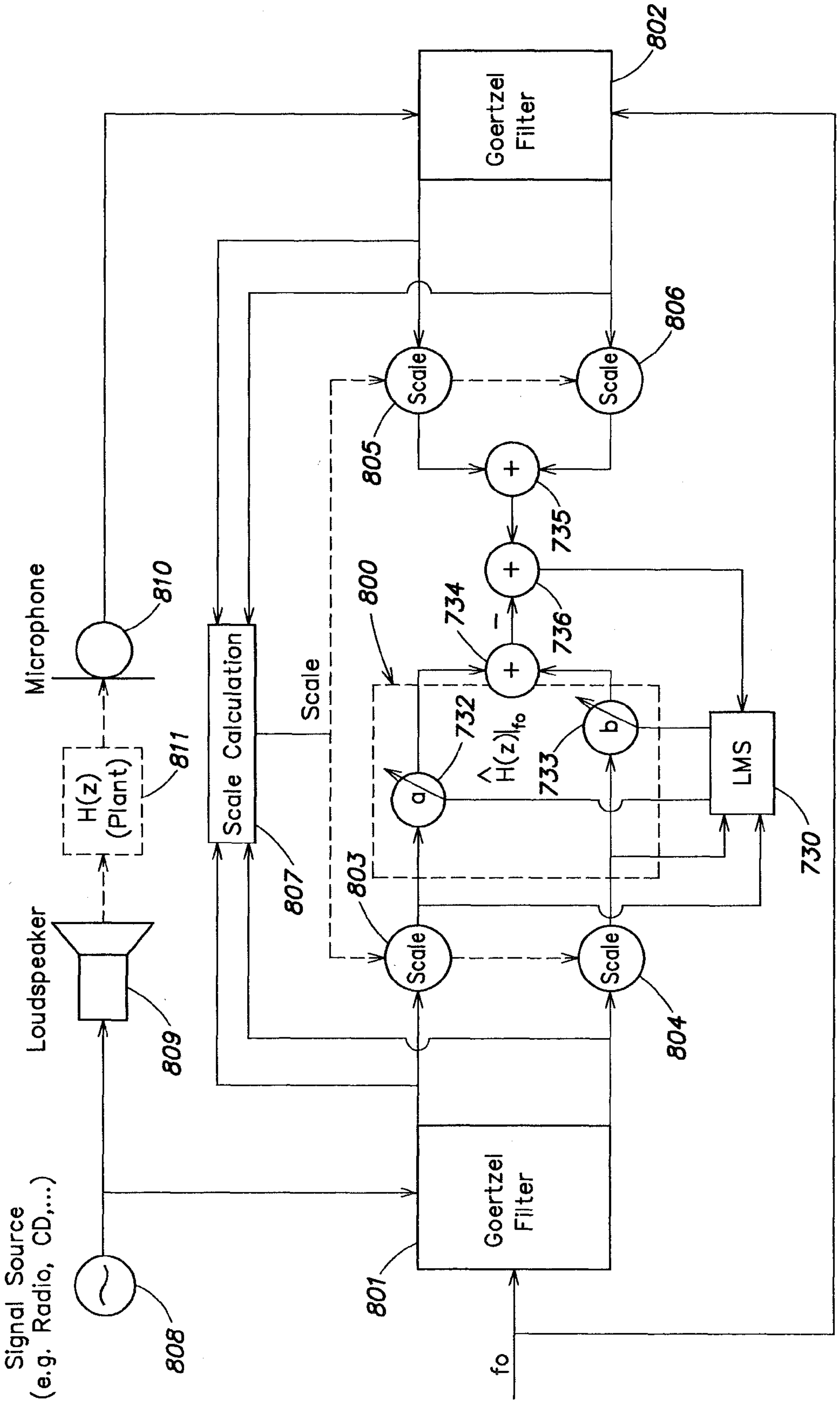
FIG. 32 is a block diagram illustration of an arrangement for automatically controlling gain.

A simple to implement AGC will be illustrated with reference to FIG. 32 by way of an exemplary system for estimating an unknown transfer function at a single frequency point $f_0$ having one adaptive notch filter 800 and two Goertzel filters 801, 802. The adaptive notch filter 800 is the same as shown in FIG. 28.

For fast convergence, that is satisfying operation of the adaptive notch filter, the signals input into the notch filter 800 have to be scaled. Accordingly, the signals input from the Goertzel filters 801, 802 into the notch filter 800 have to be scaled preferably by scaling units 803, 804, 805, 806, which are controlled by a scale calculation unit 807. The Goertzel filters 801, 802 receive signals from a signal source 808 fed into a loudspeaker 809 and from a microphone 810 which receives acoustic signals from the loudspeaker 809 via a secondary path 811 respectively.

The respective scaling factors of the scaling units 803, 804, 805, 806 may be calculated as follows. Analytical signals are calculated from the values of the complex signals output by the two Goertzel filters 801, 802 which are subsequently normalized to the maximum signal level. From the corresponding normalization or scaling factors the minimum signal level is calculated which forms the basis for the scaling factors.

With regard to some tracking problems that may occur in connection with adaptive filters in general as well as to approaches to solve these problems reference is made to B. Farhang-Boroujeny, "Adaptive Filters, Theory and Applications," John Wiley and Sons, October 1999, p. 471-500, which is incorporated herein by reference.

The above-mentioned systems may be implemented in microprocessors, signal processors, microcontrollers, computing devices etc. The individual system components are in this case hardware components of the microprocessors, signal processors, microcontrollers, computing devices, etc. which are correspondingly implemented by software.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. An active noise tuning system for tuning an acoustic noise generated by a noise source, comprising:

a sound sensor that detects audio at a listening location and provides a sensed signal indicative thereof;

an audio signal source that provides a useful signal indicative of audio;

a noise signal source that generates an electrical noise signal that corresponds to the acoustic noise of the noise source;

a first adaptive filter that filters the electrical noise signal and is controlled by first adaptive filter coefficients, and provides a first adaptive filter output signal;

a summer that sums the useful audio signal and the first adaptive filter output signal and provides a summed signal indicative thereof;

a sound reproduction device that acoustically emits audio indicative of the summed signal in the listening location; and a second adaptive filter having second adaptive filter coefficients, which filters the useful signal and provides a second adaptive filter output signal indicative thereof, where the second adaptive filter has a transfer function that models the acoustic path between the sound reproduction device and the sound sensor;

a second summer that receives the sensed signal and second adaptive filter output signal and provides a difference signal indicative of the difference there between; and a coefficient computational unit that receives the difference signal and provides the second adaptive filter coefficients.

2. The active noise tuning system of claim 1 where the first adaptive filter comprises an adaptive notch filter.

3. The active noise tuning system of claim 1, where the first adaptive filter comprises a least mean square computator.

4. The active noise tuning system of claim 1, where the noise source is an engine with a fixed or varying rotational speed.

5. The active noise tuning system of claim 4 where the noise signal source comprises a synthesizer that provides the electrical noise signal which is typical of the respective rotational speed of the engine.

6. The active noise tuning system of claim 5 where the synthesizer generates a fundamental with a frequency equal to, or equal to a multiple of, the rotational speed of the engine.

7. The active noise tuning system of claim 5 where the synthesizer generates both the fundamental and harmonics.

8. The active noise tuning system of claim 5 where the synthesizer provides the fundamental and/or the harmonics as orthogonal noise signals.

9. The active noise tuning system of claim 4 where a plurality of sound profiles for various engines are stored in the synthesizer.

10. The active noise tuning system of claim 1 where the sound reproduction device comprises a loudspeaker.

11. The active noise tuning system of claim 1 where the sound reproduction device comprises an actuator for generating audio.

12. An active noise tuning system for tuning an acoustic noise generated by a noise source, comprising:

a sensor that detects audio at a listening location and provides a sensed signal indicative thereof;

a source that provides a useful signal indicative of audio;

a noise signal source that generates an electrical noise signal that corresponds to the acoustic noise of the noise source;

a first adaptive filter that filters the electrical noise signal and is controlled by first adaptive filter coefficients, and provides a first adaptive filter output signal;

a summer that sums the useful signal and the first adaptive filter output signal and provides a summed signal indicative thereof;

a loudspeaker that acoustically emits audio indicative of the summed signal;

a second adaptive filter having second adaptive filter coefficients, which filters the useful signal and provides a second adaptive filter output signal indicative thereof, where the second adaptive filter has a transfer function that models the acoustic path between the loudspeaker and the sound sensor;

a second summer that receives the sensed signal and second adaptive filter output signal and provides a difference signal indicative of the difference there between;

a second adaptive filter coefficient computational unit that receives the difference signal and provides the second adaptive filter coefficients; and a first adaptive filter coefficient computational unit that receives the electrical noise signal and the difference signal, and provides the first adaptive filter coefficients.

13. An active noise tuning method for tuning an acoustic noise generated at a listening location by a noise source, comprising:

sensing at a sensor location sound in the surroundings of the listening location and providing a sensed signal;

generating a useful signal indicative of audio to be presented into the listening location;

generating an electrical noise signal which corresponds to the acoustic noise of the noise source;

adaptively filtering the noise signal using a first adaptive filter having first adaptive filter coefficients;

summing the useful signal and the electrical noise signal to provide a summed signal;

acoustically emitting audio indicative of the summed signal into the surroundings of the listening location;

adaptively filtering the useful signal, using a second adaptive filter having a transfer function indicative of acoustics within the listening location and second adaptive filter coefficients, to provide a filtered useful signal;

determining the difference between the filtered useful signal and the sensed signal, and providing a difference signal indicative thereof; and computing the second adaptive filter coefficients using the difference signal.

* * * * *